United States Patent
Chinda et al.

(10) Patent No.: US 7,939,935 B2
(45) Date of Patent: May 10, 2011

(54) ELECTRONIC DEVICE SUBSTRATE, ELECTRONIC DEVICE AND METHODS FOR FABRICATING THE SAME

(75) Inventors: Akira Chinda, Hitachi (JP); Nobuaki Miyamoto, Hitachi (JP); Koki Hirasawa, Kawasaki (JP); Kenji Uchida, Kawasaki (JP)

(73) Assignees: Hitachi Cable Ltd., Tokyo (JP); Renesas Electronics Corporation, Kanagawa (JP)

( * ) Notice: Subject to any disclaimer, the term of this patent is extended or adjusted under 35 U.S.C. 154(b) by 1134 days.

(21) Appl. No.: 11/701,337

(22) Filed: Feb. 1, 2007

(65) Prior Publication Data

US 2007/0268675 A1 Nov. 22, 2007

(30) Foreign Application Priority Data

May 22, 2006 (JP) ................................. 2006-141336

(51) Int. Cl.
*H01L 23/12* (2006.01)
*H01L 23/053* (2006.01)
(52) U.S. Cl. ...................................................... 257/700
(58) Field of Classification Search .................. 257/700
See application file for complete search history.

(56) References Cited

U.S. PATENT DOCUMENTS

| 7,187,559 B2 * | 3/2007 | Hirabayashi et al. ......... 361/780 |
| 7,235,477 B2 | 6/2007 | Ogawa | |
| 2004/0112724 A1 * | 6/2004 | Wong ............................ 200/182 |
| 2006/0192287 A1 * | 8/2006 | Ogawa et al. ................. 257/758 |

FOREIGN PATENT DOCUMENTS

| EP | 1 519 414 A1 | 3/2005 |
| JP | 2004-39867 | 2/2004 |
| JP | 2004-111536 | 4/2004 |
| JP | 2004-253674 | 9/2004 |
| KR | 10-2005-0020739 | 3/2005 |

* cited by examiner

*Primary Examiner* — Jeremy C Norris
(74) *Attorney, Agent, or Firm* — Scully, Scott, Murphy & Presser, PC

(57) ABSTRACT

A core substrate-less electronic device is fabricated by using an electronic device substrate 10. The electronic device substrate 10 a metal core substrate 11, and an external connection wiring layer 100 provided on the metal core substrate 11, and an electronic parts-mounting layer 110 provided on the external connection wiring layer 100. The external connection wiring layer 100 has a first plating film 103 as an external connection terminal, and a PSR film 101 as an electrical insulating material. The electronic parts-mounting layer 110 has a conductive film 113 as an internal conductor pattern and a PSR film 111 as an electrical insulating material. A surface of the conductive film 113 is in a same plane as a surface of the PSR film 111.

24 Claims, 22 Drawing Sheets

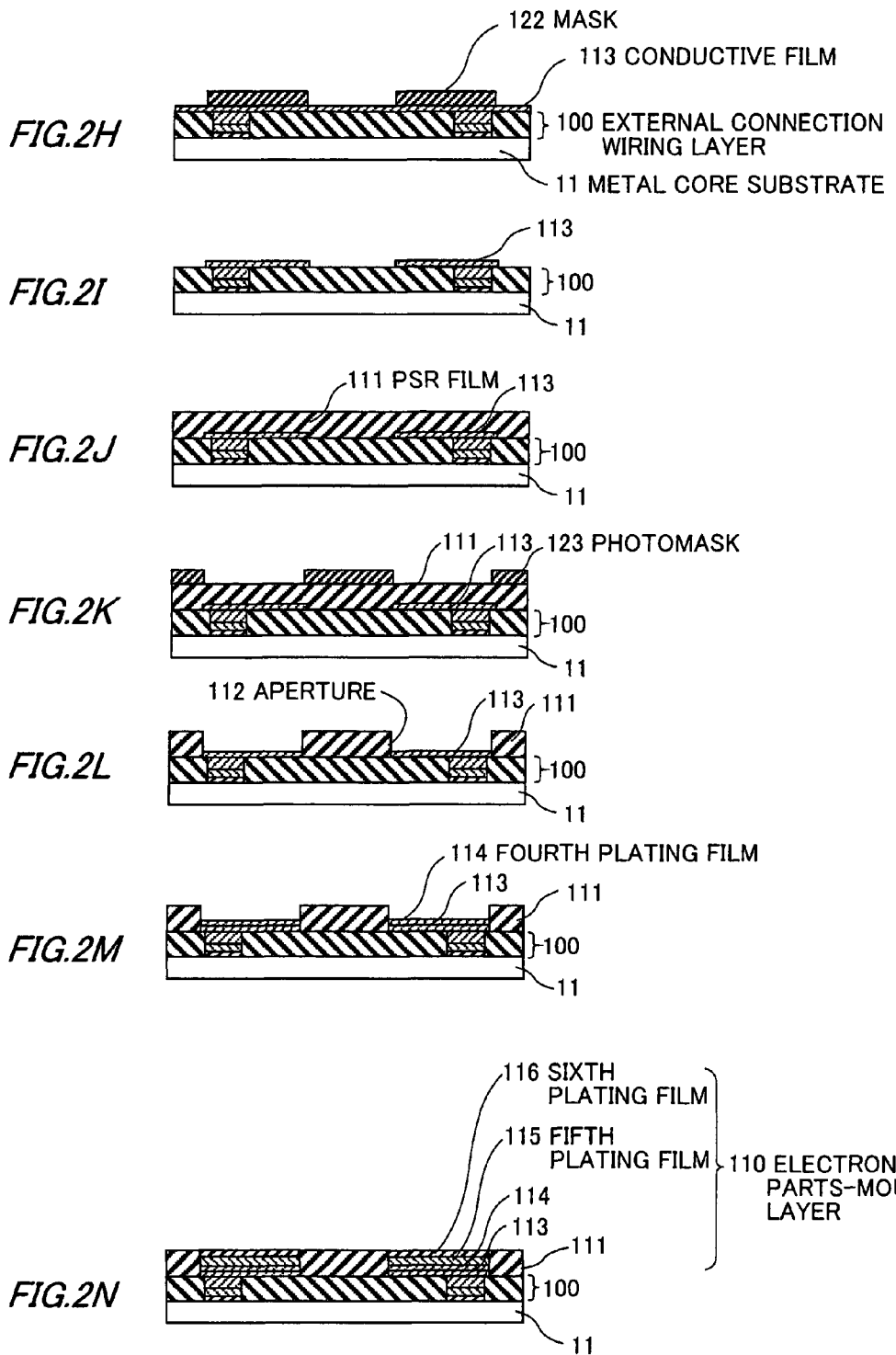

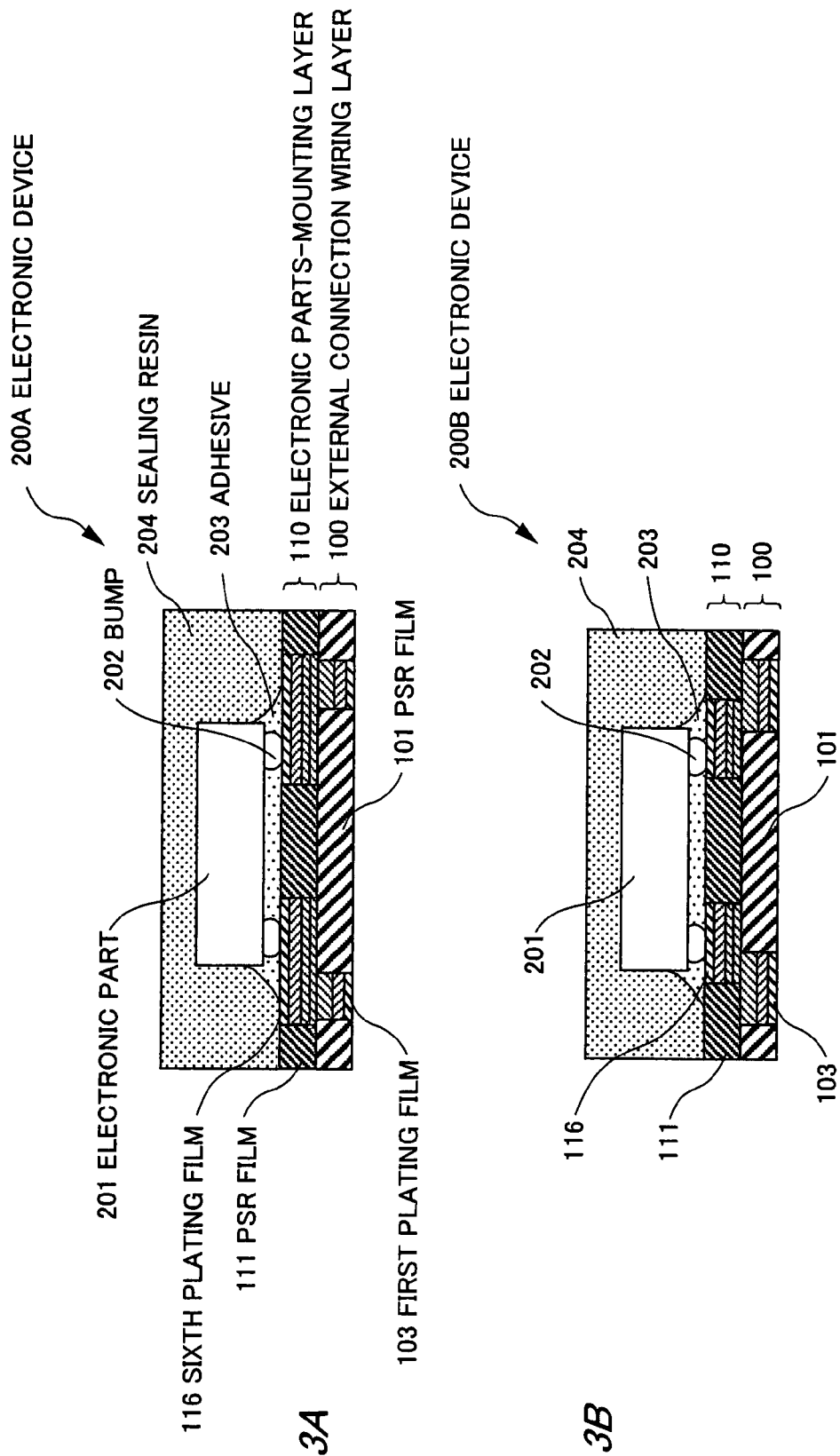

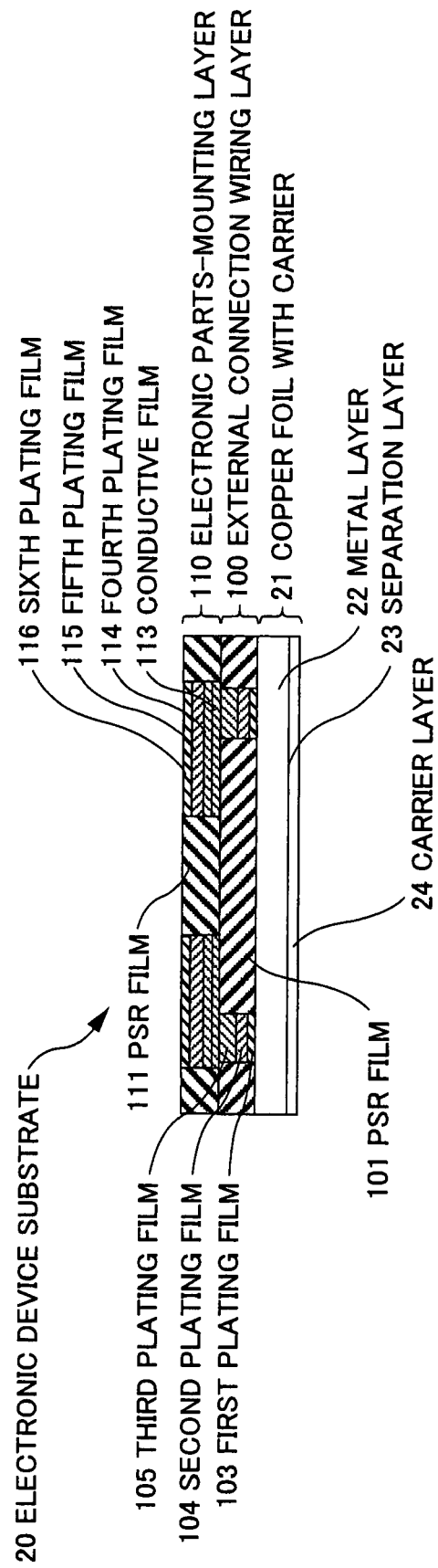

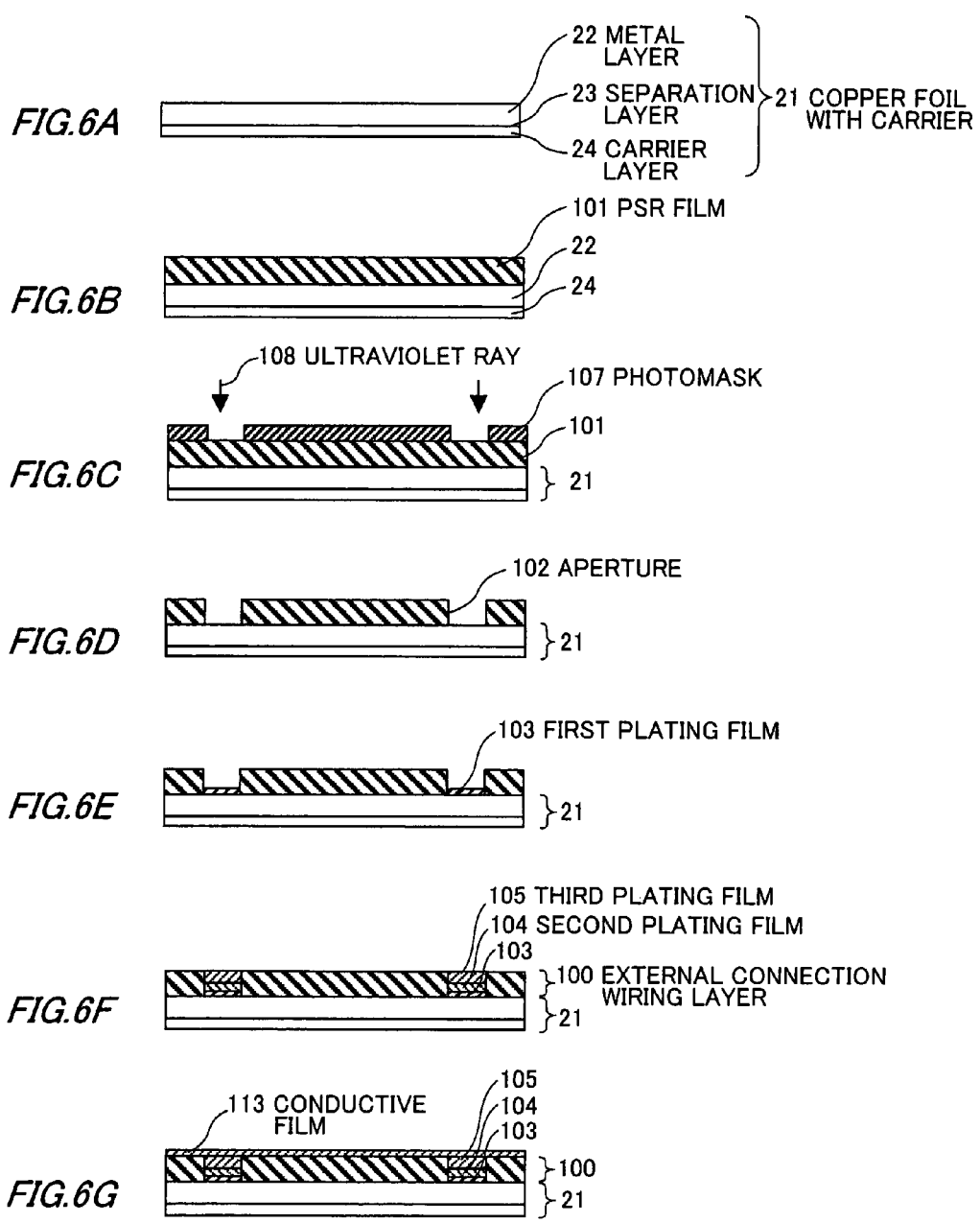

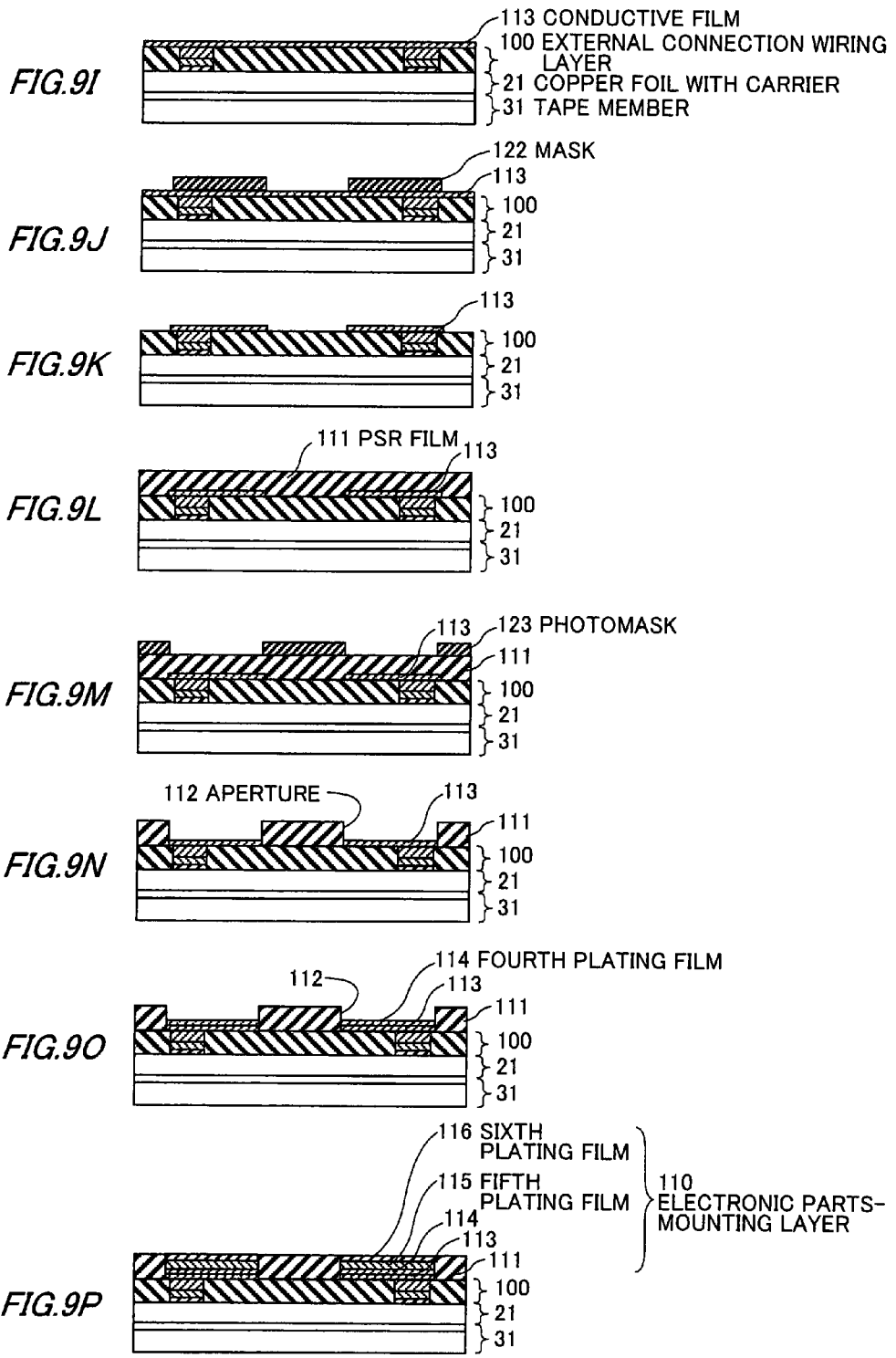

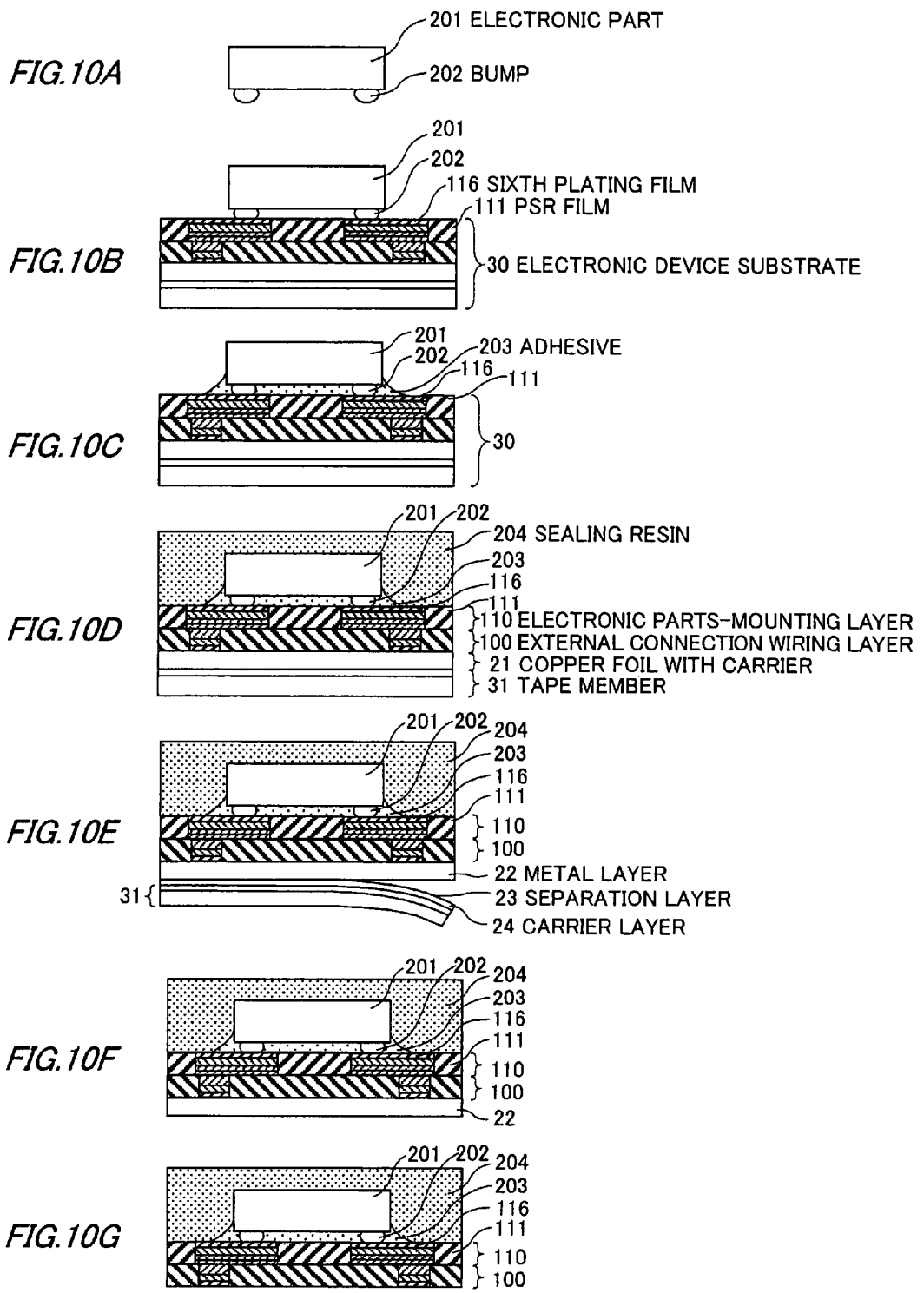

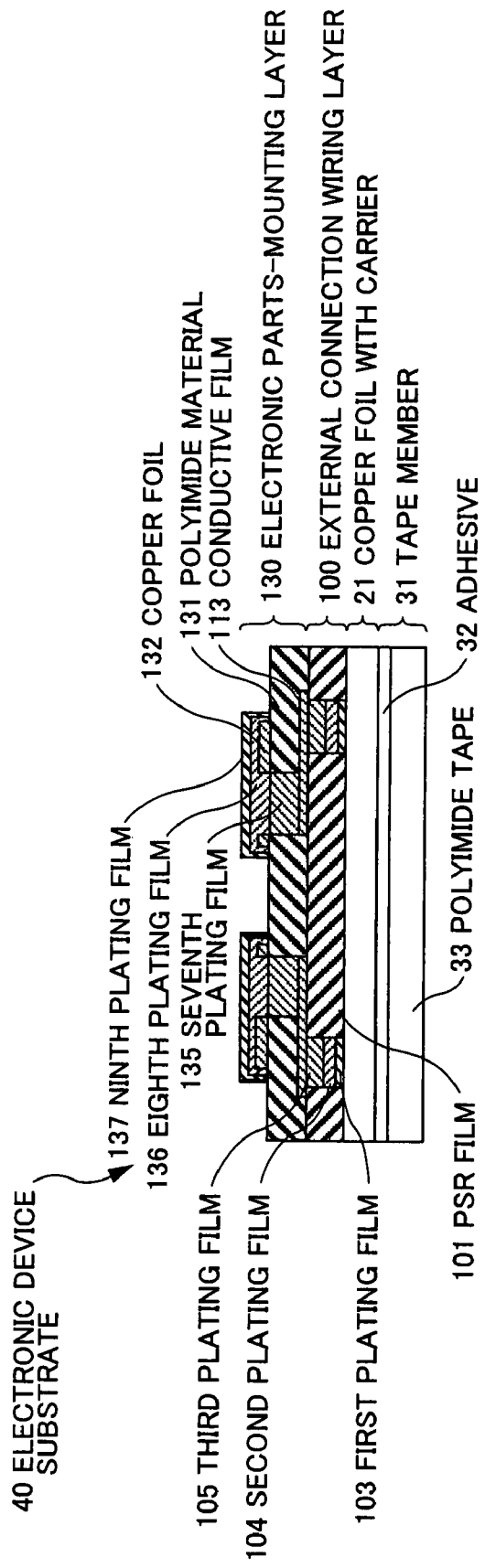

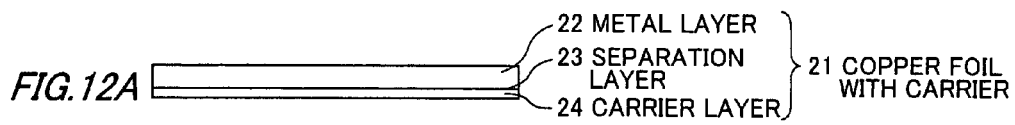
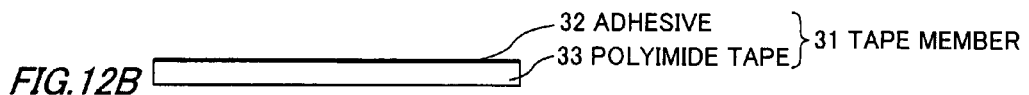
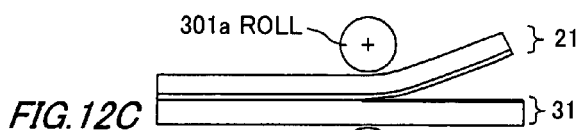
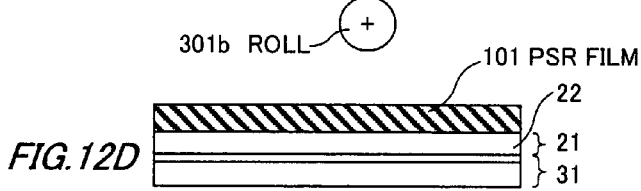
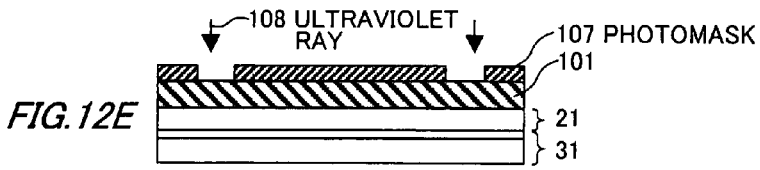
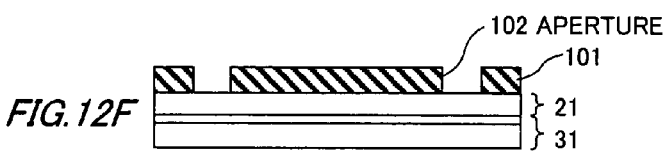
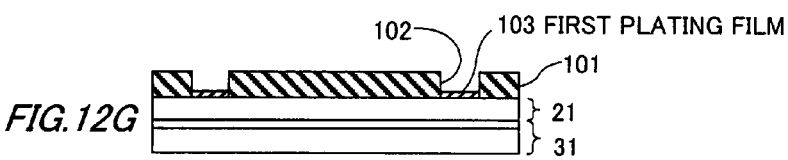
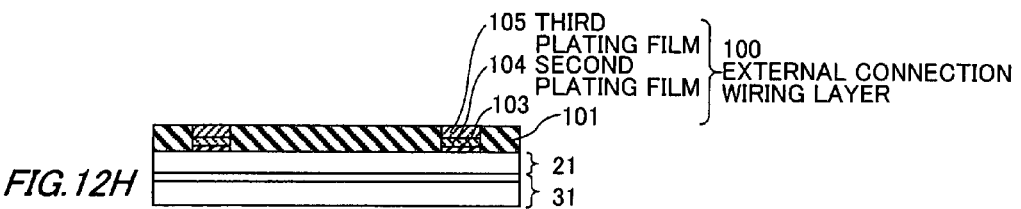

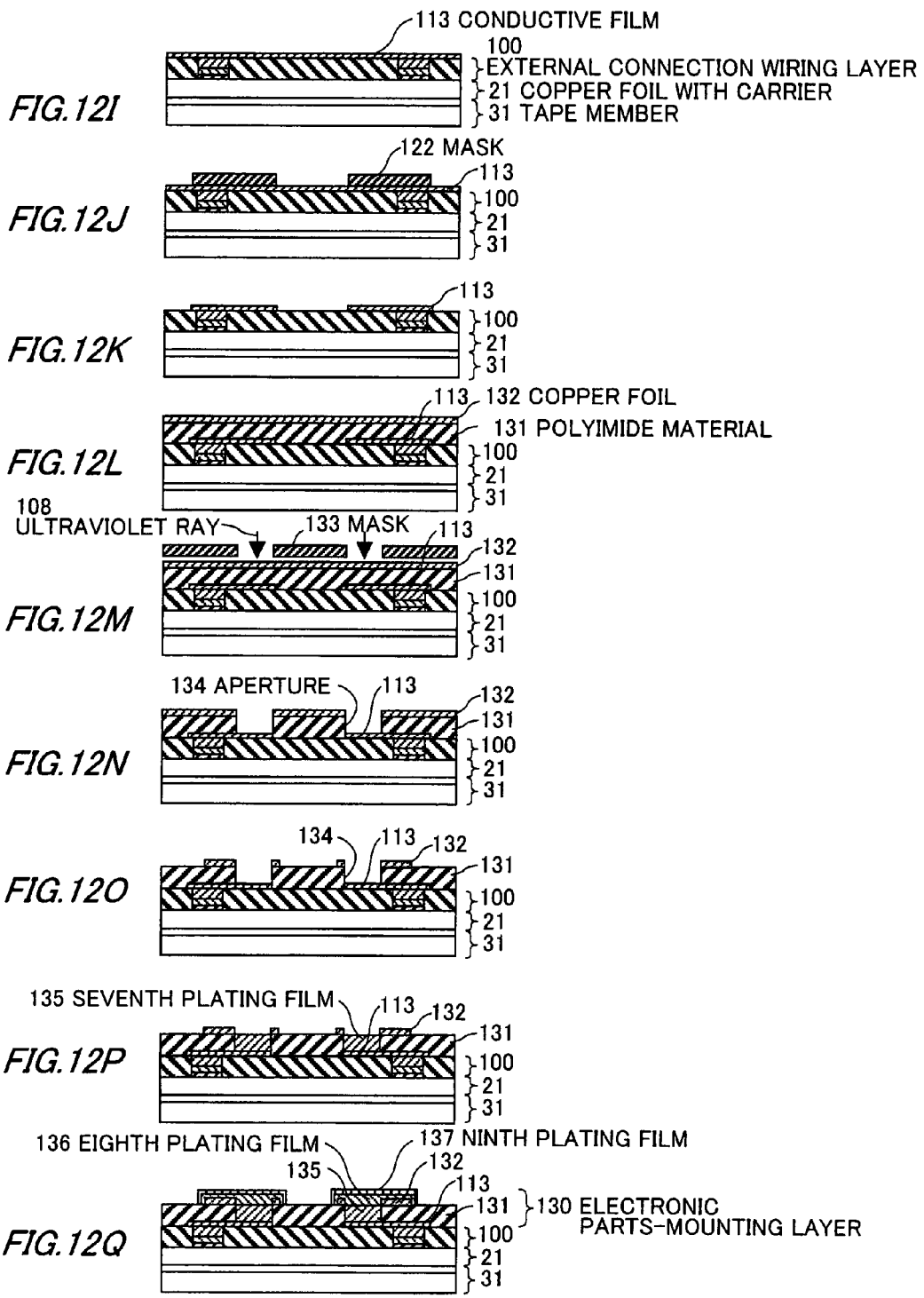

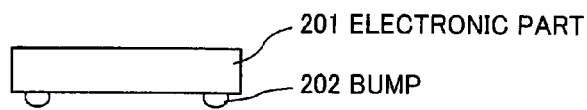
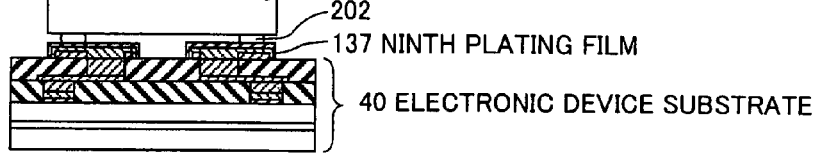
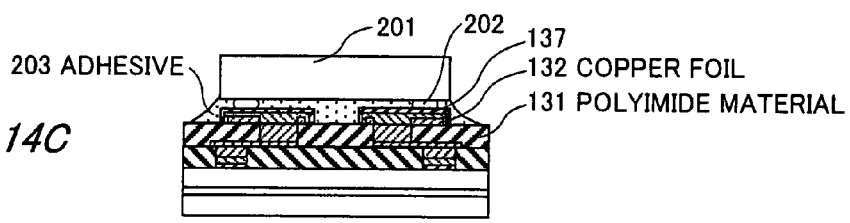
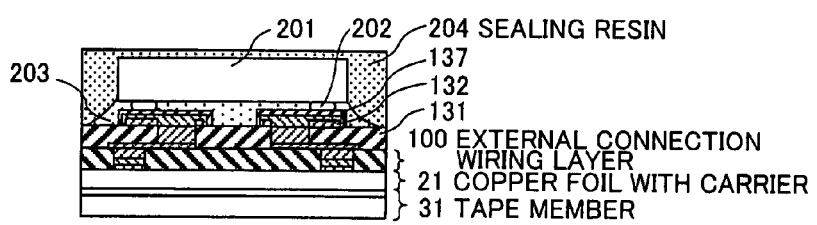
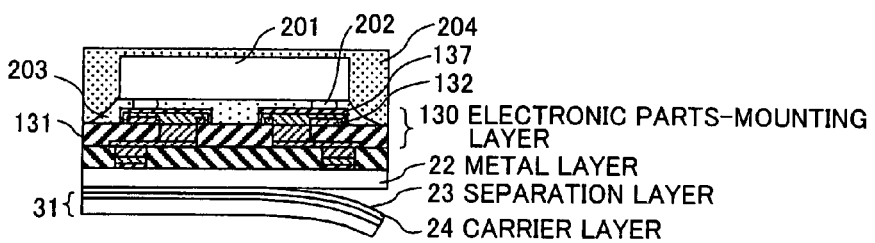
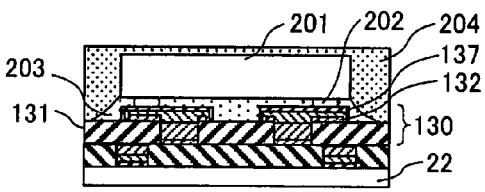
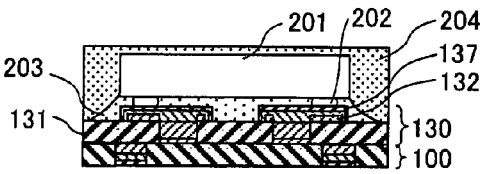

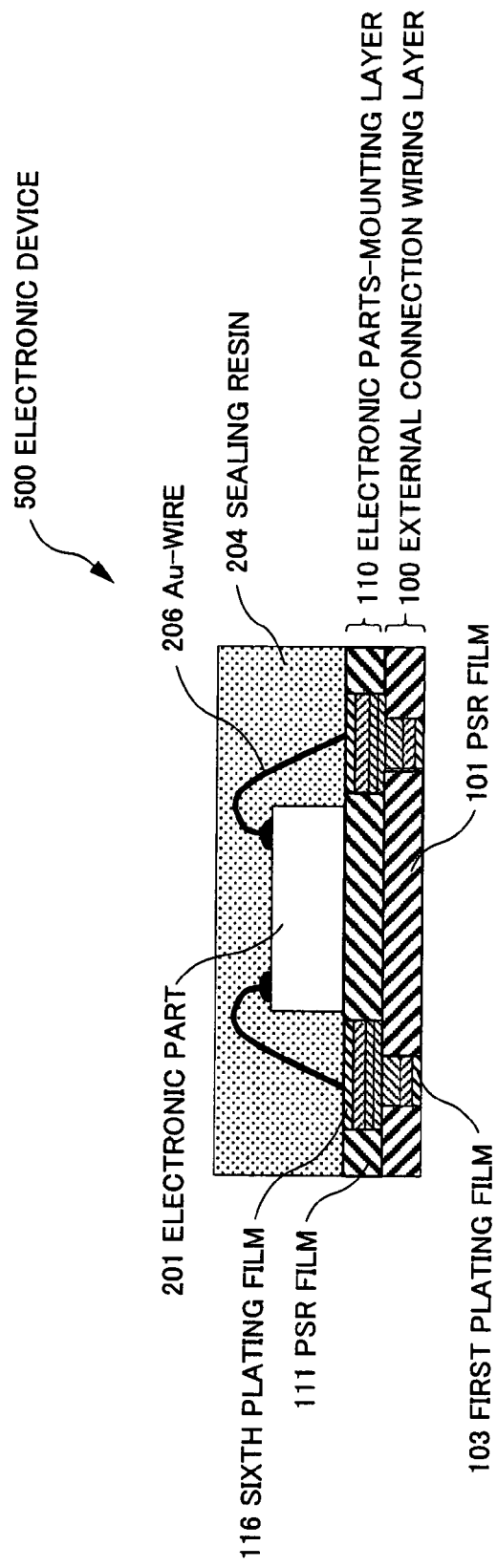

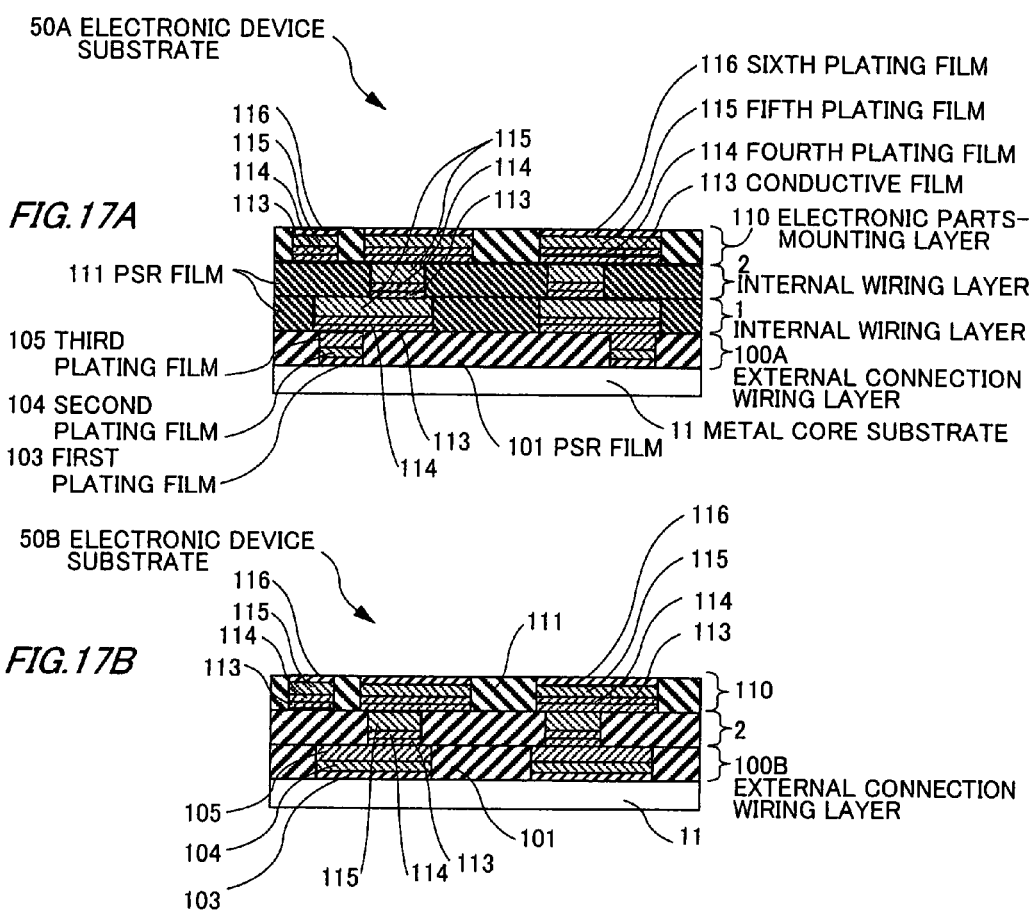

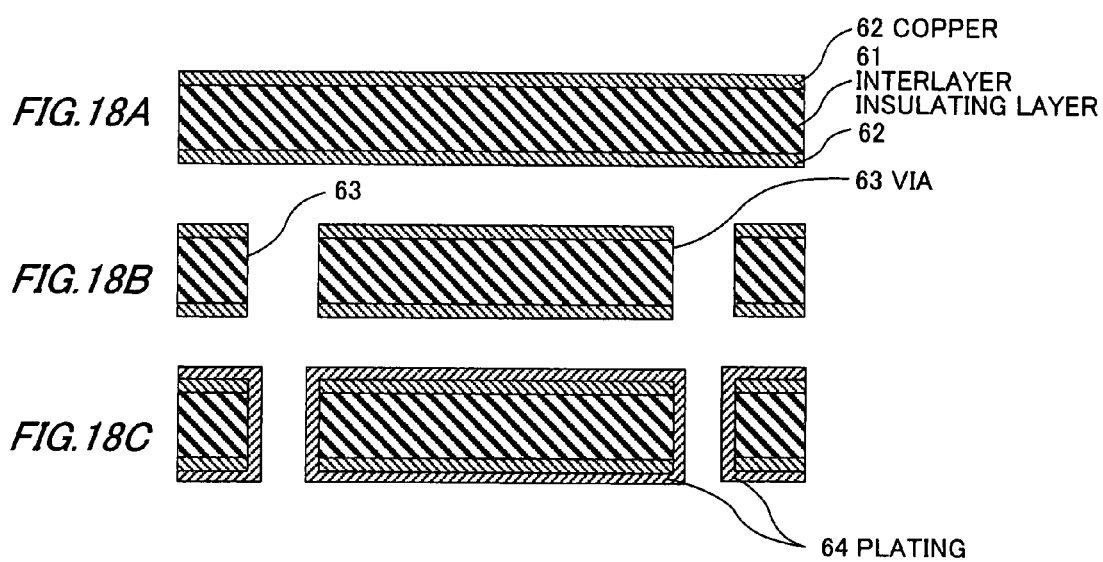

ELECTRONIC DEVICE SUBSTRATE, ELECTRONIC DEVICE AND METHODS FOR FABRICATING THE SAME

The present application is based on Japanese patent application No. 2006-141336, the entire contents of which are incorporated herein by reference.

BACKGROUND OF THE INVENTION

1. Field of the Invention

The present invention relates to an electronic device substrate, an electronic device and methods for fabricating the same, and in more particularly, to an electronic device substrate, an electronic device substrate, and methods for fabricating the same, that enable a core substrate-less package having an internal electrical wiring, in which a load of a process of removing a core substrate is reduced, by using a physical peeling off as well as a chemical dissolution, an electrochemical dissolution, or a mechanical polishing process.

2. Description of the Related Art

In accordance with technical development of recent years, a miniaturization of a package for an electronic device has been requested, so that an electronic device of so-called "core substrate-less package" is put to practical use.

As an example of typical core substrate-less packages, a conventional electronic device is described in Japanese Patent Laid-Open No. 2004-253674 (JP-A-2004-253674, FIG. 3). This electronic device is fabricated as follows. Electronic parts are mounted on a substrate comprising a core substrate and a metal electrode connected on the core substrate, and a predetermined electrode is electrically connected to the electronic parts by a thin metallic wire and sealed by a resin. Thereafter, the core substrate is physically peeled off, so that the metal electrode is exposed to a lower surface (back surface) of the package.

Since this electronic device is covered with the sealing resin and has a leadless structure in which the metal electrode is exposed at the back surface, a substrate part is only the metal electrode, so that this electronic device is very thin.

In addition, as another example of the core substrate-less package, another conventional electronic device is proposed by Japanese Patent Laid-Open No. 2004-111536 (JP-A-2004-111536, FIG. 1).

In this electronic device, a first wiring layer is disposed on a first interlayer insulating layer, a second interlayer insulating layer is disposed thereon, the second interlayer insulating layer is provided with an opening at a predetermined position, a via-conductor is disposed at the predetermined position, and interlayer insulating layers each having a wiring layer and a via-conductor are sequentially disposed thereon for a desired number of times, and a metal supporting frame is provided on the layers, to provide a substrate configuration.

In the Japanese Patent Laid-Open No. 2004-111536 (paragraph [0038]), the electronic device is construed by a general flip-chip fabrication method in which a semiconductor is further connected to this substrate via a metal bump.

However, according to the configuration disclosed in Japanese Patent Laid-Open No. 2004-253674, since no supporting member is provided in a circumference of the metal electrode, there is a disadvantage in that the multilayer wiring is difficult.

In addition, according to the configuration disclosed in Japanese Patent Laid-Open No. 2004-111536, the multilayer wiring is possible by virtue of the interlayer dielectric layer. However, a very thin substrate such as the electronic device disclosed in Japanese Patent Laid-Open No. 2004-253674 cannot be realized.

As thus described, there is the first problem in that a very thin substrate generally used in the typical core substrate-less package is not compatible with the multilayer wiring configuration. This is caused by forming the via-conductor for constituting the multilayer wiring configuration. The reason will be described in more detail as follows.

As described above, the multilayer substrate can be fabricated by virtue of the existence of the interlayer insulating layer in the configuration disclosed by Japanese Patent Laid-Open No. 2004-253674. However, since this multilayer substrate has a configuration in that copper layers are laminated on a top surface and a bottom surface of the interlayer insulating layer for each of single layer plates and the wiring pattern is disposed thereon, the via-conductor for connecting between the wiring patterns on the top and bottom surfaces is required.

FIGS. 18A to 18C are cross sectional views for briefly explaining a process for via processing and conductive plating.

At first, copper layers 62 are laminated at a top surface and a bottom surface of an interlayer insulating layer 61 in a substrate as shown in FIG. 18A, and a via 63 is formed as shown in FIG. 18B. Next, as shown in FIG. 18C, a conductive plating 64 is provided for connecting the copper layers 62 (wiring patterns) at the top and bottom surfaces around the via 63. This means that a total thickness of the upper and lower wiring patterns is required in addition to a thickness of the interlayer insulating layer 61 for a total thickness of each of the single layer plates. Furthermore, when a conductor (generally composed of copper) is provided by plating at side surfaces of the via 63 in course of the via-conductor preparation, circulation of a plating liquid is not good due to a minute bore, and a plating growth is difficult since the plating is provided on an insulating material. Therefore, a plating thickness is required to be about 10 μm on the wiring pattern for obtaining a bonding reliability. Accordingly, a total thickness of the wiring pattern is generally about 25 to 30 μm, as a result of addition of the plating thickness to the thickness of the wiring pattern originally provided. For fabricating the multilayer substrate, the thickness of the wiring pattern is required for the number of wiring pattern layers.

The second problem is that a size of a wiring part is large. This is also caused by the via-conductor. The reason is that a wiring pattern forming process is not the same process as a via boring process, dimensions of formed articles should have allowance for absorbing a gap between positions of each of the formed articles in these two processes.

FIG. 18D is a schematic plan view of a periphery of a via.

When a conductive part (via-land 65) is positioned to surround around the via 63 and a pattern (wiring 66) conducted from a part of the via-land 65 is laid out, the via-land 65 is generally formed to have an allowance of about 50 μm greater than a via diameter at one side, and of about 100 μm greater than the via diameter, with considering a positioning precision in the via formation and a positioning precision in the pattern formation, for securely connecting the wiring pattern to be connected to the via-conductor.

In addition, there is so-called flip-chip method for connecting the substrate to the electronic part via the bump, as a method for reducing a size and a thickness of the electronic device. According to this method, bonding electrodes for the substrate can be formed inside the electronic part, so that the electronic device can be miniaturized compared with a case where the electronic part and the substrate are connected with each other via a thin metallic wire. Further, when the above described bonding is conducted by using the metallic wire, a height for installing the thin metallic wire is necessary. In the flip-chip method, this height for installing the thin metallic wire is only a height for installing the bump, so that the miniaturization can be realized. On the other hand, in the flip-chip method, the electrode in the electronic part is small by reason of the minute processing and an interval between the electrodes is dense. Therefore, it is necessary to actually form an internal wiring on the substrate and to determine a position of an external electrode such that the external electrode can be mounted on a mother board for mounting the electronic device, so as to provide the electronic device. Accordingly, forming a thin and small substrate similar to a typical substrate-less package to have multilayers means that the flip-chip method can be adopted in the general core substrate-less package, and it is very important to promote the small sizing and miniaturization of the electronic device.

SUMMARY OF THE INVENTION

Accordingly, it is an object of the present invention to provide an electronic device substrate, an electronic device comprising the electronic device substrate and the methods for fabricating the same in that a multilayer wiring can be provided while having a very thin substrate used in the core substrate-less package.

According to a first aspect of the invention, an electronic device substrate comprises:

a core substrate;

an external connection wiring layer provided on the core substrate comprising an external connection terminal and a first electrical insulating material; and a circuit wiring layer laminated for one or more layers comprising an internal conductor pattern and a second electrical insulating material, a surface of the internal conductor pattern being in a same plane as a surface of the second electrical insulating material.

The electronic device substrate according to the present invention may comprise at least one of following features.

(1) The circuit wiring layer further comprises a via-hole conductor provided at an aperture of the second electrical insulating material, and the via-hole conductor is integrated with the internal conductor pattern.

(2) The via-hole conductor comprises one or more plating films.

(3) An uppermost layer of the circuit wiring layer is an electronic-parts mounting layer, and an uppermost layer of the plating films in the electronic parts-mounting layer is subjected to a surface treatment necessary for connection with an electronic part.

(4) An uppermost layer of the circuit wiring layer is an electronic-parts mounting layer, and an external conductor pattern is formed on a surface for mounting an electronic part.

(5) The external conductor pattern comprises a copper foil.

(6) The core substrate comprises a copper foil, a stainless steel foil, an aluminum foil, an aluminum alloy foil, a nickel foil, a nickel alloy foil, a tin foil or a tin alloy foil (7) The core substrate comprises a carrier layer composed of a metal; a separation layer formed on the carrier layer; and a metal layer formed on the separation layer and disposed at a side of the external connection wiring layer.

(8) An adhesion force between the metal layer and the carrier layer via the separation layer is smaller than that between the metal layer and the external connection wiring layer.

(9) The separation layer comprises an organic system separation layer or an inorganic system separation layer.

(10) The metal layer comprises a copper foil, a copper alloy foil, a stainless steel foil, an aluminum foil, an aluminum alloy foil, a nickel foil, a nickel alloy foil, a tin foil or a tin alloy foil.

(11) The electron device substrate further comprises a supporting substrate attached to the core substrate.

(12) The supporting substrate comprises an insulating film.

(13) The second electrical insulating material comprises a solder resist or a photosolder resist.

(14) The second electrical insulating material comprises a polyimide or an epoxy when provided as an uppermost layer disposed at an opposite side to the core substrate, and comprises a solder resist or a photosolder resist when provided as a layer other than the uppermost layer.

(15) The internal conductor pattern comprises a copper, a copper alloy, a nickel, or a nickel alloy.

(16) The via-hole conductor comprises a single layer or a laminated layer composed of a gold, a silver, a copper, a copper alloy, a nickel, a nickel alloy, or palladium.

(17) The external connection terminal comprises an external connection plating film formed at an aperture of the first electrical insulating film.

(18) The external connection wiring layer further comprises a tin-diffusion preventing plating film formed at an aperture of the first electrical insulating film, and the tin-diffusion preventing plating film is integrated with the external connection plating film.

(19) A thickness of the tin-diffusion preventing plating film is 5 µm or more when the tin-diffusion preventing plating film comprises a copper or copper alloy plating, and 3 µm or more when the tin-diffusion preventing plating film comprises a nickel or nickel alloy plating.

According to a second aspect of the invention, a method for fabricating an electronic device substrate comprises the steps of:

forming a first electrical insulating material on one side of a core substrate;

forming an aperture in the first electrical insulating material;

forming an external connection terminal at the aperture;

forming an internal conductor pattern on the first electrical insulating material; and forming a second electrical insulating material on the first electrical insulating material such that a surface of the second electrical insulating material is in a same plane as a surface of the internal conductor pattern.

The method for fabricating an electronic device substrate according to the present invention may comprise at least one of following features.

(1) The method for fabricating an electronic device substrate further comprises the steps of:

forming an aperture in the second electrical insulating material; and forming a via-hole conductor integrally with the internal conductor pattern at the aperture.

(2) The method for fabricating an electronic device substrate further comprises the steps of:

laminating an electrical insulating substrate having a copper foil on an uppermost layer; and forming an external conductor pattern by processing the copper foil.

(3) The core substrate comprises a composite substrate comprising a carrier layer, a separation layer, and a metal layer.

(4) The core substrate comprises a composite substrate comprising a carrier layer, a separation layer, and a metal layer, and a supporting substrate is integrated with the composite substrate.

(5) The supporting substrate comprises an electrical insulation film having an adhesive, and the supporting substrate is integrated with the composite substrate by using the adhesive.

(6) The first electrical insulating material is adhered to the core substrate by coating or pressure welding.

According to a third aspect of the invention, an electronic device comprises:

an electronic device substrate including:

an external connection wiring layer comprising an external connection terminal and a first electrical insulating material; and a circuit wiring layer laminated for one or more layers comprising an internal conductor pattern and a second electrical insulating material, a surface of the internal conductor pattern being in a same plane as a surface of the second electrical insulating material; and an electronic part provided on the electronic device substrate.

The electronic device may comprise according to the present invention at least one of following features.

(1) The external connection terminal is connected to a solder ball.

(2) The electronic part is electrically connected to the electronic device substrate via a metal thin wire.

(3) The electronic part is electrically connected to the electronic device substrate via a bump.

According to a fourth aspect of the invention, a method of fabricating an electronic device comprises the steps of:

mounting an electronic part on an electronic device substrate, the electronic device substrate comprising a core substrate, an external connection wiring layer provided on the core substrate comprising an external connection terminal and a first electrical insulating material, and a circuit wiring layer laminated for one or more layers comprising an internal conductor pattern and a second electrical insulating material, a surface of the internal conductor pattern being in a same plane as a surface of the second electrical insulating material;

electrically connecting a predetermined electrode of the electronic part to the external connection wiring layer;

coating at least a part for electrically connecting the electronic part to the external connection wiring layer with an insulating coating material; and removing the core substrate from the electronic device substrate.

The method for fabricating an electronic device substrate according to the present invention may comprise at least one of following features.

(1) The core substrate is removed by chemical dissolution, electrochemical dissolution, machine polishing or combination thereof.

(2) The core substrate comprises a plurality of layers including at least a separation layer formed between a carrier layer and a metal layer, and a layer including the carrier layer and the metal layer is physically separated from another layer including the metal layer, and the metal layer is removed by chemical dissolution, electrochemical dissolution, machine polishing or combination thereof.

In the present invention, the electronic part includes chip components such as a capacitor, a transistor, a diode, an electric filter as well as an IC (integrated circuit).

According to present invention, it is possible to provide an electronic device substrate, an electronic device comprising the electronic device substrate and the methods for fabricating the same in that a multilayer wiring can be provided while having a very thin substrate used in the core substrate-less package.

BRIEF DESCRIPTION OF THE DRAWINGS

Preferred embodiments of the present invention will be described in conjunction with appended drawings, wherein:

FIGS. 3A and 3B are cross sectional views of an electronic device in a second preferred embodiment according to the present invention, wherein FIG. 3A is a cross sectional view showing an electronic device using the electronic device substrate in the first preferred embodiment, and FIG. 3B is a cross sectional view showing an electronic device using a variation of the electronic device substrate in the first preferred embodiment;

FIG. 5 is a cross sectional view of an electronic device substrate in a third preferred embodiment according to the invention;

FIG. 10 is an explanatory diagram showing a manufacturing process of an electronic device in a sixth preferred embodiment using the electronic device substrate in the fifth preferred embodiment;

FIG. 11 is a cross sectional view of an electronic device substrate in a seventh preferred embodiment according to the invention;

FIGS. 12A to 12Q are explanatory diagrams showing a manufacturing process of the electronic device substrate of FIG. 11;

FIGS. 13A and 13B are cross sectional views of an electronic device in an eighth preferred embodiment according to the invention, wherein FIG. 13A is a cross sectional view showing an electronic device using an electronic device substrate in the seventh preferred embodiment, and FIG. 13B is a cross sectional view showing an electronic device using a variation of the electronic device substrate in the seventh preferred embodiment;

FIG. 14A to 14G are explanatory diagrams showing a manufacturing process of the electronic device in the eighth preferred embodiment using the electronic device substrate in the seventh preferred embodiment;

FIG. 16 is a cross sectional view of a wire bonding type electronic device in an embodiment according to the present invention;

FIGS. 17A and 17B are cross sectional views of the electronic device substrates in the embodiment according to the present invention, wherein FIG. 17A is a cross sectional view showing the electronic device substrate (four layers), and FIG. 17B is a cross sectional view showing the electronic device substrate (triple layers); and FIGS. 18A to 18D are explanatory diagrams showing a via in the electronic device substrate, wherein FIGS. 18A to 18C are cross sectional views for briefly explaining a process of via processing and conductive plating, and FIG. 18D is a schematic plan view of a periphery of the via.

DETAILED DESCRIPTION OF PREFERRED EMBODIMENTS

Next, an electronic device, an electronic device substrate, and methods for fabricating the same will be explained in more detail in conjunction with the appended drawings.

First Preferred Embodiment

Configuration of Electronic Device Substrate

Figure 1:
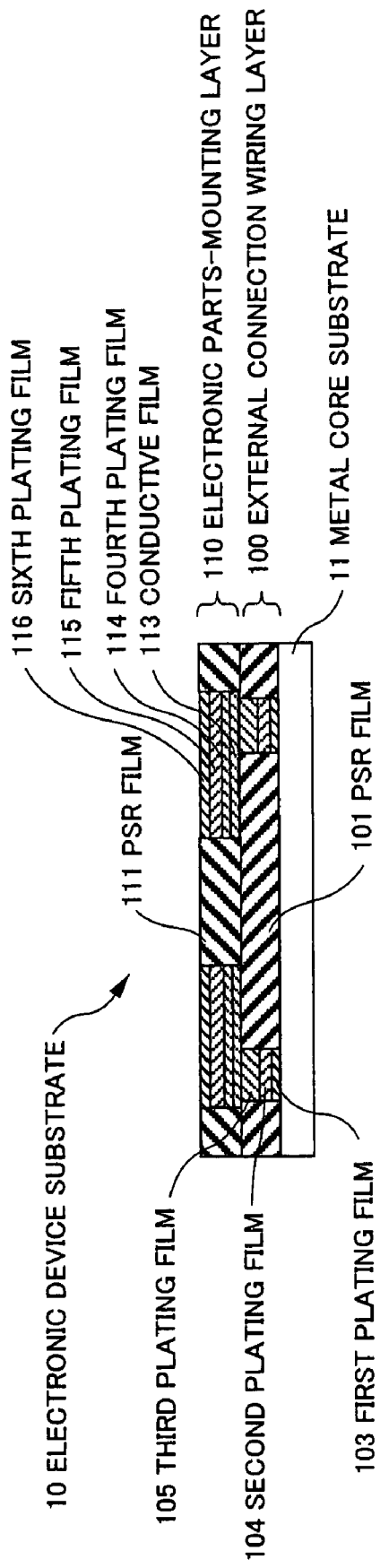
FIG. 1 is a cross sectional view of an electronic device substrate in a first preferred embodiment according to the present invention.

FIG. 1 is a cross sectional view of the electronic device substrate in the first preferred embodiment according to the present invention.

An electronic device substrate 10 comprises a thin plate-like metal core substrate 11, an external connection wiring layer 100 provided on the metal core substrate 11, and an electronic parts-mounting layer 110 provided on the external connection wiring layer 100.

A. Metal Core Substrate 11

As for the metal core substrate 11, a copper foil is most preferable from point of views such as of easiness of procurement, cost, high electrical conductivity, easiness of removal in the final process, however, the present invention is not limited thereto, and a stainless steel foil, an aluminum foil, an aluminum alloy foil, a nickel foil, a nickel alloy foil, a tin foil or a tin alloy foil may be used.

In addition, it is necessary to provide the metal core substrate 11 with a thickness not less than 20 μm, since a mechanical durability is required in transportation and processing. On the other hand, when an electronic device is fabricated by using the electronic device substrate 10, the metal core substrate 11 should be finally removed. At this time, if the metal core substrate 11 is thick, a long time is required for the removal process both in a chemical dissolution method and a mechanical polishing method. So as to solve this problem, the thickness of the metal core substrate 11 is reduced by reinforcing with the external connection wiring layer 100 (PSR film 101), so that a time required for the dissolution or polishing in the removal process of the metal core substrate 11 can shorten. For example, the mechanical durability and the abbreviation of the removal processing time may be expected by using the copper foil with a thickness of 12 μm.

B. External Connection Wiring Layer 100

The external connection wiring layer 100 is provided on the metal core substrate 11 and comprises a photosolder resist (referred as "PSR", hereinafter) film 101 composed of an electrical insulating material that is provided with an aperture 102, to which a conductive plating (a first plating film 103, a second plating film 104, and a third plating film 105 when viewed from a side of the metal core substrate 11) is applied. As for the third plating film 105 that is the uppermost layer of the conductive plating, a surface of the third plating film 105 is in the same plane as a surface of the PSR film 101.

A combination of the first to third plating films 103 to 105 and the PSR film 101 constitutes the external connection wiring layer 100, and a thickness of the external connection wiring layer 100 is determined to be not greater than 30 μm, so as to reduce the thickness of the electronic device.

For the PSR film 101, an organic resist film such as indissoluble solder resist and photoresist may be used.

The first plating film 103 is subjected to a surface treatment required for connecting this electronic device to the outside when the electronic device is completed. When the electronic device is mounted by soldering, a gold, a silver, a palladium, a nickel, a tin, a solder plating or the like is suitable. When the electronic device is mounted by pressure welding with using an anisotropic conductive film (ACF), an anisotropic conductive paste (ACP), a non-conductive paste (ACP), a non-conductive film (NCF), a non-conductive paste (NCP) or the like, a gold, a silver, a palladium, a nickel or the like is suitable.

The second plating film 104 is provided as a barrier layer for preventing diffusion of tin in the solder into the gold or the like (tin-diffusion preventing barrier layer), when the solder is used for connecting the electronic device to the mounting substrate, after an electronic device in the second preferred embodiment described later is fabricated by using the electronic device substrate in the first preferred embodiment. As a material of the second plating film 104, a copper plating, a copper alloy plating, a nickel plating, a nickel alloy plating or the like may be used. For example, a thickness of the second plating film 104 is not less than 5 μm in a case where the copper or copper alloy plating is used, and not less than 3 μm in a case where the nickel plating or the nickel alloy plating is used.

The third plating film 105 is provided for taking an electrical connection between the conductive film 113 which is the lowermost layer of the electronic parts-mounting layer 110 described below at least in one part. As a material of the third plating film 105, a copper is most preferable from point of views such as high electrical conductivity and cost, however, may be a copper alloy, a nickel, a nickel alloy or the like. The third plating film 105 may be the same metal material as the second plating film 104, and the second plating film 104 may be formed such that a surface thereof is in the same plane as the surface of the PSR film 101.

C. Electronic Parts-Mounting Layer 110

The electronic parts-mounting layer 110 is provided on the external connecting wiring layer 100 and comprises a PSR film 111 that is provided with an aperture 112, to which a conductive film 113 and a conductive plating (a fourth plating film 114, a fifth plating film 115, and a sixth plating film 116) are applied. The fourth to sixth plating films 114 to 116 are configured with considering the installation of the electronic part and electrical bonding with a metal thin wire.

A combination of the conductive film 113, the fourth to sixth plating films 114 to 116 and the PSR film 111 constitutes the electronic parts-mounting layer 110, and a thickness of the electronic parts-mounting layer 110 is determined to be not greater than 30 μm, so as to reduce the thickness of the electronic device.

For the PSR film 111, an organic resist film such as an indissoluble solder resist and a photoresist may be used.

The conductive film 113 is provided for taking an electrical connection with the third plating layer 105 which is the uppermost layer of the external connection wiring layer 100 at least in one part. As a material of the conductive film 113, a copper is most preferable from point of views such as high electrical conductivity and cost, however, may be a copper alloy, a nickel, a nickel alloy or the like.

The fourth plating film 114 is provided as an intermediate conductive plating for taking an electrical connection between the conductive film 113 and the fifth plating film 115. As a material of the fourth plating film 114, a copper plating (with a thickness of e.g. 10 µm) may be used from point of views such as high electrical conductivity and cost. Other materials such as a copper alloy, a nickel, a nickel alloy or the like may be also used. The fourth plating film 114 may be the same metal material as the fifth plating film 115.

A material of the fifth plating film 115 is required to be composed of a hard material, since a bump 202 of an electronic part 201 is electrically connected to the sixth plating film 116 by using supersonic wave, thermo-compression bonding or the combination thereof. As the material of the fifth plating film 115, for example, the nickel which is comparatively hard material may be used (with a thickness of e.g. 0.75 µm). As the material of the fifth plating film 115, a nickel or a palladium is suitable, however, it is not the limited thereto, and other material may be used in accordance with the bonding method of electronic part.

The sixth plating film 116 is an uppermost layer of the electronic parts-mounting layer 110 for mounting the bump 202 of the electronic part 201. The sixth plating film 116 is subjected to the surface treatment which is necessary for bonding with the electronic part, and provided for taking an electrical connection with the bump 202 of the electronic part 201. As the material of the sixth plating film 116, a gold, a silver, a palladium or the like may be used. In addition, a gold, a tin, a palladium, a solder plating or the like is required, when the electronic parts on which a gold bump or a solder bump is formed are bonded by the flip-chip method.

(Method for Fabricating the Electronic Device Substrate)

Next, a method for fabricating the electronic device substrate in the first preferred embodiment will be explained.

Figure 2A:
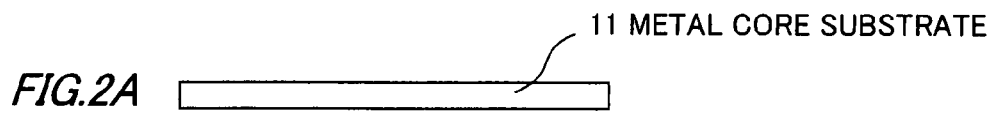
FIGS. 2A to 2N are explanatory diagrams showing a manufacturing process of the electronic device substrate of FIG. 1.

FIGS. 2A to 2N are explanatory diagrams showing a manufacturing process of the electronic device substrate of FIG. 1.

At first, as shown in FIG. 2A, a copper foil having a thickness of e.g. 12 µm is prepared as a metal core substrate 11.

Figure 2B:

On one side of the metal core substrate 11, a PSR film 101 is coated to have a thickness of e.g. 15 µm by screen printing or the like as shown in FIG. 2B. In place of the coating, the PSR film 101 may be bonded by pressure welding.

Figure 2C:
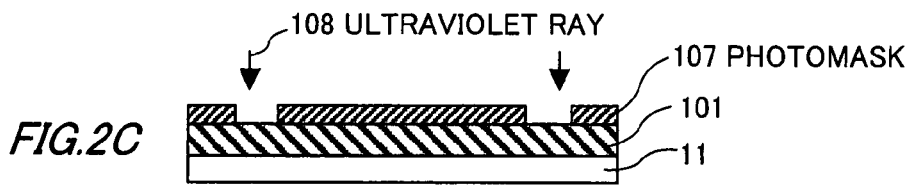

Next, as shown in FIG. 2C, the PSR film 101 is covered with a photomask 107, and UV ray 108 is irradiated at a region to be provided as an external connecting terminal.

Figure 2D:

As shown in FIG. 2D, an aperture 102 is formed by development in a desired configuration on the PSR film 101.

Figure 2E:
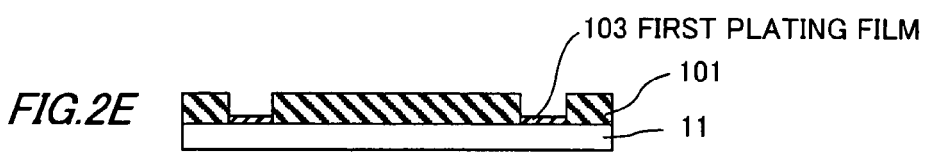
Figure 2F:
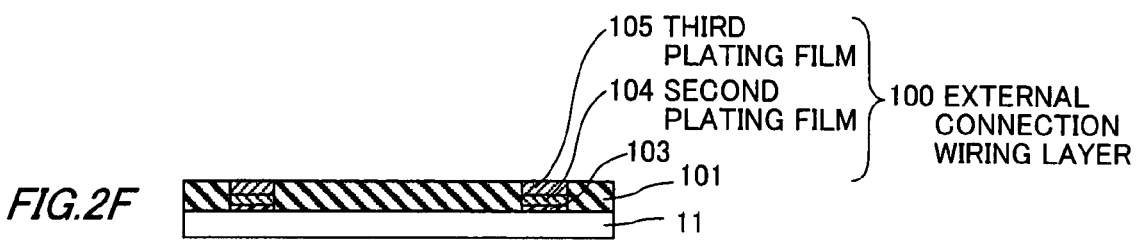

Next, as shown in FIGS. 2E and 2F, a first plating film 103, a second plating film 104, and a third plating film 105 are sequentially formed on the aperture 102 by electrolysis plating. A conductive plating film comprising the first to third plating films 103 to 105 is formed on the aperture 102 to have a predetermined thickness such that a surface of the conductive plating film is on the same plane as a surface of the PSR film 101, to provide an external connection wiring layer 100.

Figure 2G:
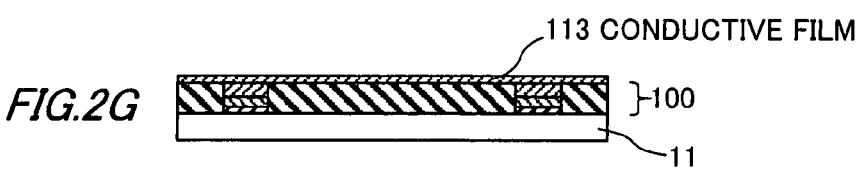

As shown in FIG. 2G, a conductive film 113 composed of the copper or the like is formed in a shape of foil by vacuum deposition on an entire surface of the PSR film 101 and the third plating film 105. After forming the conductive film 113 as an evaporation film, the conductive film 113 is processed to have a desired configuration by etching or the like. For the formation of the conductive film 113, a technique of bonding a conductive foil with a conductive adhesive may be used other than the vacuum deposition, and also a sputtering method can be used. In addition, it is possible to grow a copper thin film on the entire surface by electroless plating method and to process the copper film to have a desired thickness by electrolysis plating method thereafter.

Next, as shown in FIGS. 2H and 2I, after forming the conductive film 113 as a wiring by using a mask 122 to have a predetermined configuration for mounting the electronic part.

As shown in FIG. 2J, a PSR film 111 is applied to an upper surface of the PSR film 101 and the conductive film 113.

Next, as shown in FIGS. 2K and 2L, an aperture 112 is formed at a predetermined position of the conductive film 113 by using a photomask 123, similarly to a boring process of the external connection wiring layer 100.

Next, as shown in FIGS. 2M and 2N, a fourth plating film 114, a fifth plating film 115, and a sixth plating film 116 are sequentially formed on the aperture 112 by conductive plating to provide an electronic parts-mounting layer 110. As described above, an electronic device substrate 10 is fabricated.

Effect of the First Preferred Embodiment

According to the first preferred embodiment, following effects can be obtained.

(1) The electronic device substrate in the first preferred embodiment has a configuration in which a thin plate-like electrical insulating material is provided with an aperture, a conductor is formed in the aperture of the electrical insulating material, a single layer plate is provided by forming a via-hole conductor that functions as a conductive pattern, and a plurality of single layer plates formed similarly thereto are laminated, while taking a conduction between upper and lower wirings by contacting the aforementioned conductors in the upper and lower layers each other. According to this structure, the wiring patterns conventionally formed on the upper and lower surfaces of the electrical insulating material is embedded in an electrical insulation layer, so that only a thickness of the electrical insulation layer is equivalent to a thickness of a single layer which constitutes a multilayer substrate. As a result, the thickness of the single layer is thinner by a thickness of the wiring pattern than that of a normal substrate. Therefore, it is possible to provide a thin electronic device in that both of a very thin substrate normally found in the core substrate-less package and a multilayer wiring configuration are realized.

(2) A via configuration is not required, since the wiring patterns between the upper and lower layers are connected with each other by directly laminating the single layer plates as described above as the upper and lower layers. According to this structure, a land of the via-hole for electrically connecting the electronic parts-mounting layer and the external connection wiring layer is also unnecessary. Therefore, it is possible to provide a small sized electronic device by reducing a surface of the wiring pattern while using the multilayer substrate.

(3) In the configuration of the conventional multilayer substrate, a layer provided for an external connecting terminal and a layer provided for a via-hole are respectively required. According to the first preferred embodiment, these layers can be combined into a single layer, so that it is effective for reducing the thickness of the substrate.

Second Preferred Embodiment

Configuration of Electronic Device

FIGS. 3A and 3B are cross sectional views of an electronic device in the second preferred embodiment according to the present invention, wherein FIG. 3A is a cross sectional view showing an electronic device using the electronic device substrate in the first preferred embodiment, and FIG. 3B is a cross sectional view showing an electronic device using a variation of the electronic device substrate in the first preferred embodiment.

In the variation of the electronic device substrate in the first preferred embodiment, a width of the conductive plating films (comprising the first to third plating films 103 to 105) of the external connection wiring layer 100 is made broader than that of the first preferred embodiment, and a width of the conductive film 113 of the electronic parts-mounting layer 110 and the conductive plating films (comprising the fourth to sixth plating films 114 to 116) are made narrower than that of the first preferred embodiment. Further, both ends of the conductive film 113 and the conductive plating films are dislocated from both sides of the electronic device to a portion in vicinity of a center, namely, a distance from the both sides of the electronic device to the conductive film 113 and the conductive plating films are broadened.

An electronic device 200A shown in FIG. 3A comprises an electronic device substrate 10 in the first preferred embodiment and an electronic part 201 electrically connected to an electronic parts-mounting layer 110 of the electronic device substrate 10 via a bump 202. However, a metal core substrate 11 of the electronic device substrate 10 is already removed.

The electronic part 201 and the electronic parts-mounting layer 110 are fixed to each other by means of an adhesive 203, so as to reinforce the electrical connection between the bump 202 and the electronic parts-mounting layer 110. In addition, a circumference of the electronic part 201 is covered with a sealing resin 204 for protecting the electronic part 201.

A conductive plating of the external connection wiring layer 100 of the electronic device substrate 10 comprises a first plating film 103 used for external connection, a second plating film 104 functioning as a barrier layer for preventing a trouble due to diffusion of tin (Sn) in the solder into a metal of an external terminal, when the solder is used for connecting the completed electronic device to an external substrate (mounting substrate: mother board), and a third plating film 105 used for electrically connecting with the electronic parts-mounting layer 110.

The electronic parts-mounting layer 110 comprises a conductive film 113 electrically connected to the third plating film 105 and a fourth to sixth plating films 114 to 116 as via-hole conductors to provide a single unit. Namely, the via-hole conductor is integrated with the plating films. The conductive film 113 has a function as a via-hole conductor for electrical connection other than a function as an internal circuit wiring (conductor pattern). In other words, an electrical signal of the electronic part 201 is transmitted to the first plating film 103 through the bump 202, the conductive plating films comprising the fourth to sixth plating films 114 to 116 of the electronic parts-mounting layer 110, the conductive film 113, and the second and third plating films 104, 105 of the external connection wiring layer 100.

An electronic device 200B shown in FIG. 3B has a configuration and functions similar to the electronic device 200A, except that the variation of the electronic device substrate 10 in the first preferred embodiment is used.

(Method for Fabricating the Electronic Device)

Next, a method for fabricating the electronic device in the second preferred embodiment will be described with reference to FIGS. 4A to 4E.

FIGS. 4A to 4E are explanatory diagrams showing a manufacturing process of the electronic device of FIG. 3A.

Figure 4A:
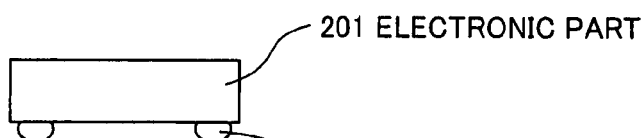
FIGS. 4A to 4E are explanatory diagrams showing a manufacturing process of the electronic device of FIG. 3A.

Firstly, an electronic device substrate 10 in the first preferred embodiment is prepared. Then, as shown in FIG. 4A, a bump 202 is provided at an output electrode of the electronic part 201.

Figure 4B:
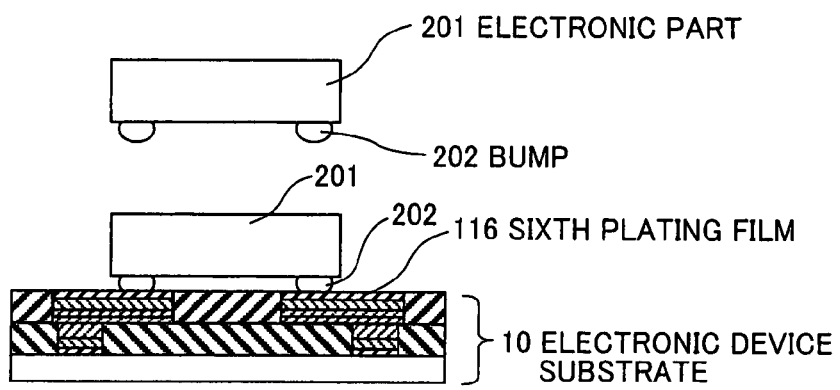

Next, as shown in FIG. 4B, the electronic part 201 is bonded by the flip-chip method to a sixth plating film 116 of an electronic parts-mounting layer 110 of the electronic device substrate 10.

Figure 4C:
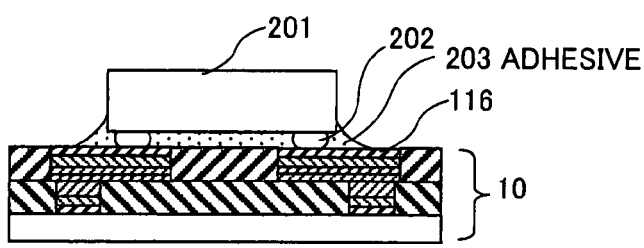

As shown in FIG. 4C, the electronic part 201 and the electronic parts-mounting layer 110 are fixed to each other by means of an adhesive 203, so as to reinforce the electrical connection between the bump 202 and the electronic parts-mounting layer 110.

Figure 4D:
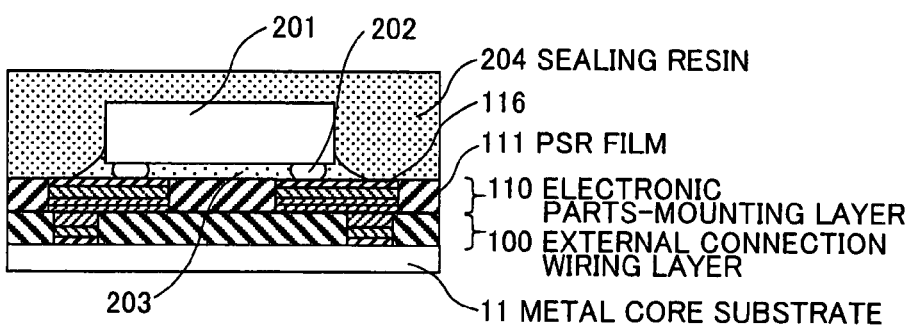

Next, as shown in FIG. 4D, the electronic part 201 and an electronic parts-mounting surface of the electronic parts-mounting layer 110 are covered with a sealing resin 204 by transfer molding for protecting the electronic part 201.

Figure 4E:
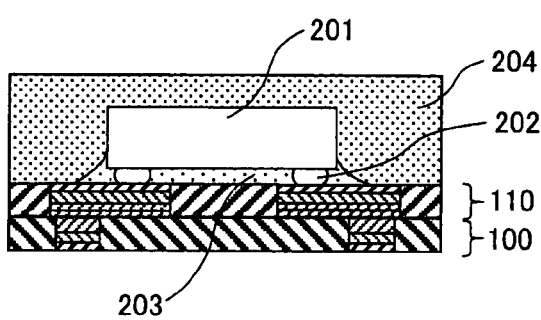

As shown in FIG. 4E, the metal core substrate 11 is removed by chemical dissolution, electrochemical dissolution, machine polishing or combinations thereof to provide a core substrate-less multilayer wiring type electronic device 200A.

The electronic device 200B shown in FIG. 3B can be fabricated similarly to the electronic device 200A.

Effect of the Second Preferred Embodiment

According to the second preferred embodiment, following effects can be obtained.

(1) By using the electronic device substrate in the first preferred embodiment, a thin electronic device can be obtained. In addition, a small electronic device can be obtained.

(2) By using the electronic device substrate in the first preferred embodiment, the flip-chip bonding can be conducted while using the core substrate-less package. In the conventional core substrate-less package, such a configuration cannot be formed since the internal wiring is same as the external electrode (For example, FIG. 1 of JP-A-2004-253674). In the second preferred embodiment, since the wiring part has a double layer wiring structure by using the core substrate-less package, it is possible to separate the external electrode from the internal wiring, so that a distance between the external electrodes can be varied from a narrow pitch between the electrodes on the electronic part to a pitch required for mounting the electronic device by utilizing the internal wiring.

(3) As an effect particular to the electronic device 200B, a width of the conductive film 113 of the electronic parts-mounting layer 110 and the conductive plating film (comprising the fourth to sixth plating films 114 to 116) are reduced such that the position of the conductive film 113 of the electronic parts-mounting layer 110 are dislocated from the sides of the electronic device to the center part. Therefore, an area of the electronic device can be reduced compared with that of the electronic device 200A.

Third Preferred Embodiment

Configuration of Electronic Device Substrate

FIG. 5 is a cross sectional view of an electronic device substrate in the third preferred embodiment according to the present invention.

An electronic device substrate 20 has a configuration similar to that of the electronic device substrate in the first preferred embodiment, except that the metal core substrate 11 that is the core substrate is replaced with a copper foil 21 with carrier. Therefore, configurations of the external connection wiring layer 100 and the electronic parts-mounting layer 110 are same as those of the first preferred embodiment.

The copper foil 21 with carrier comprises a metal layer 22, a carrier layer 24, and a separation layer 23 disposed between the metal layer 22 and the carrier layer 24. The metal layer 22 is facing to a PSR film 101 and a first plating film 103 of an external connection wiring layer 100.

(Method for Fabricating the Electronic Device Substrate)

Next, a method for fabricating the electronic device substrate in the third preferred embodiment will be explained.

Figure 6H:
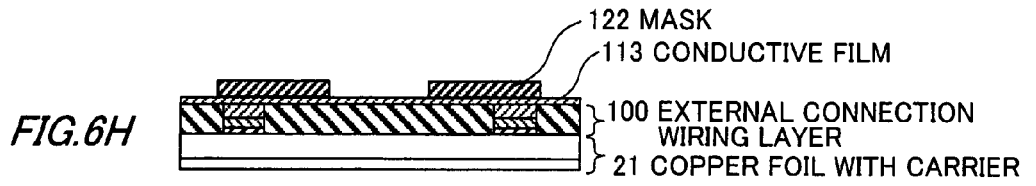
FIGS. 6A to 6N are explanatory diagrams showing a manufacturing process of the electronic device substrate of FIG. 5.
Figure 6I:
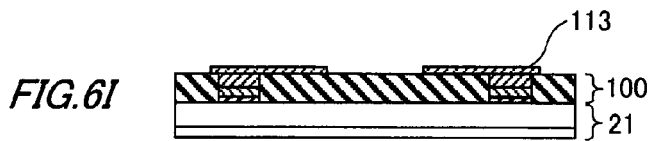
Figure 6J:
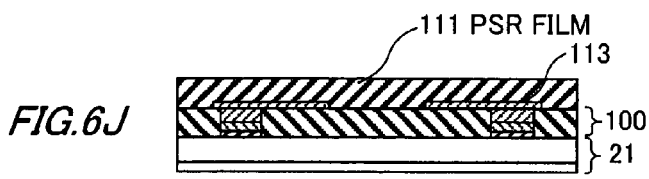
Figure 6K:
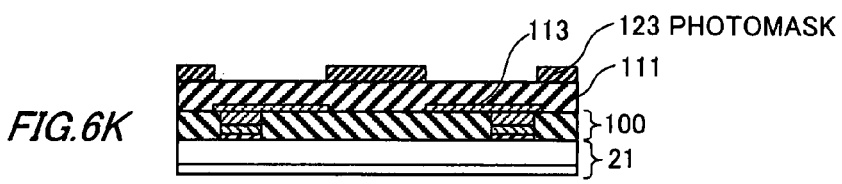
Figure 6L:
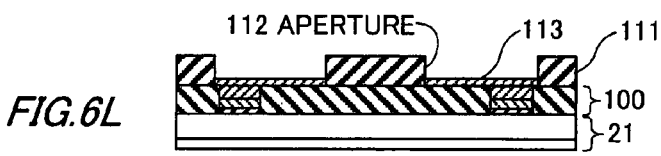
Figure 6M:
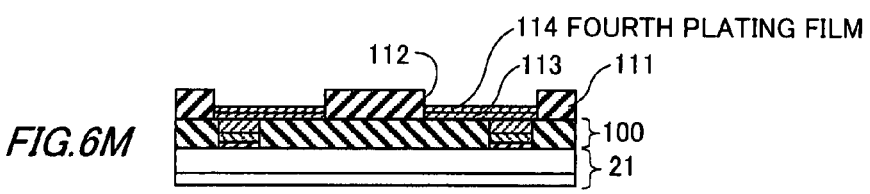
Figure 6N:
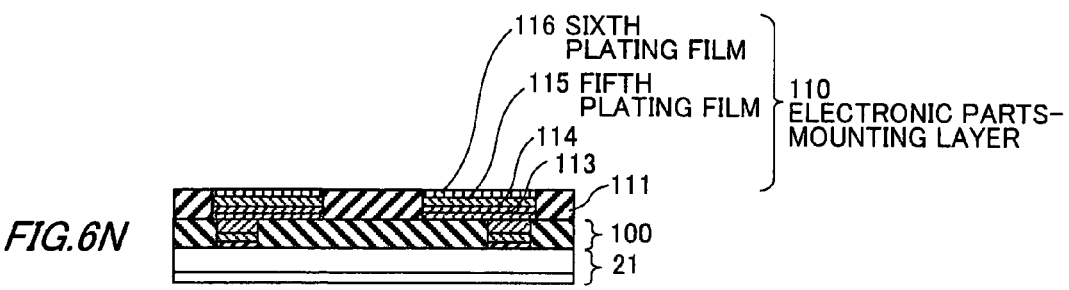

FIGS. 6A to 6N are explanatory diagrams showing a manufacturing process of the electronic device substrate of FIG. 5.

Firstly, as shown in FIG. 6A, a copper foil 21 with carrier having a triple layer configuration comprising a metal layer 22, a carrier layer 24 and a separation layer 23 between the metal layer 22 and the carrier layer 24 is prepared.

Further, as shown in FIG. 6B, a PSR film 101 composed of an electrical insulating material is coated at a side where the metal layer 22 is provided, to have a thickness of e.g. 15 µm by screen printing similarly to the first preferred embodiment.

The copper foil 21 with carrier is a base material in which the separation layer 23 with a weak adhesive property that can be exfoliated in a post-process is formed on the metal layer 22 composed of a thick metal foil (herein, a copper foil) having a thickness not less than 18 µm, and the carrier layer 24 composed of a thin metal foil (having a thickness of e.g. 1 to 5 µm) is formed thereon by the electrolytic process, to provide a metal foil (herein, a copper foil). As the metal layer 22, a copper alloy foil, a stainless steel foil, an aluminum foil, an aluminum alloy foil, a tin foil, or a tin alloy foil may be used other than the copper foil.

In addition, the metal layer 22 and the separation layer 23 can be separated from each other by mechanical separation in the post-process, by increasing an adhesion force between the separation layer 23 and the carrier layer 24 than that between the separation layer 23 and the metal layer 22. This separation layer 23 may be an organic system separation layer, or an inorganic system separation layer, if the layers have a difference in adhesion force. However, it is preferable to choose the inorganic system separation layer with considering the heat resistance, when the electronic device is fabricated by a process including heat treatment.

Since the following manufacturing process (FIGS. 6C to 6N) is similar to that in the first preferred embodiment, an explanation thereof is omitted.

Effect of Third Preferred Embodiment

According to the third preferred embodiment, the effects similar to those of the first preferred embodiment can be obtained.

Furthermore, since the copper foil 21 with carrier is used in the third preferred embodiment, a physical separation method can be used in the removal process of the copper foil 21 with carrier which is the core substrate in the third preferred embodiment, so that a time for removing the metal layer 22 remained after this separation can be shortened.

Fourth Preferred Embodiment

Configuration of Electronic Device

In the fourth preferred embodiment, an electronic device using the electronic device substrate 20 in the third preferred embodiment has a configuration similar to that of the second preferred embodiment, since the copper foil 21 with carrier is removed in the manufacturing process.

(Method for Fabricating the Electronic Device)

Next, a method for fabricating an electronic device in the fourth preferred embodiment will be described with reference to FIGS. 7A to 7G.

FIGS. 7A to 7G are explanatory diagrams showing a manufacturing process of the electronic device using the electronic device substrate in the third preferred embodiment.

Firstly, an electronic device substrate 20 in the third preferred embodiment is prepared.

Figure 7A:
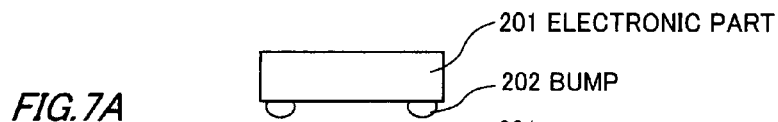
FIGS. 7A to 7G are explanatory diagrams showing a manufacturing process of the electronic device in a fourth preferred embodiment using the electronic device substrate in the third preferred embodiment.
Figure 7B:
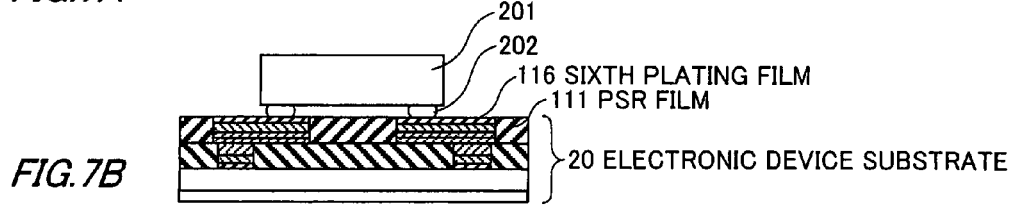
Figure 7C:
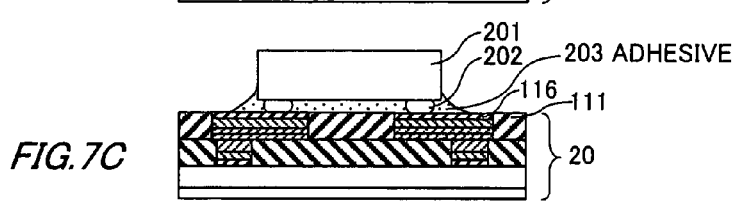
Figure 7D:
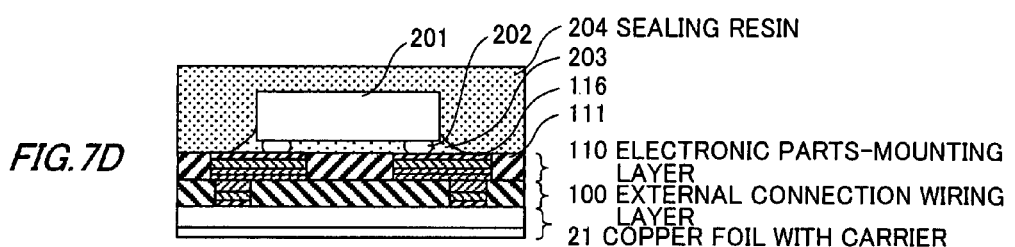

Then, as shown in FIG. 7A, a bump 202 is provided at an output electrode of the electronic part 201.

Since a part of the manufacturing process (FIGS. 7B to 7D) is similar to that in the second preferred embodiment, an explanation thereof is omitted.

Figure 7E:
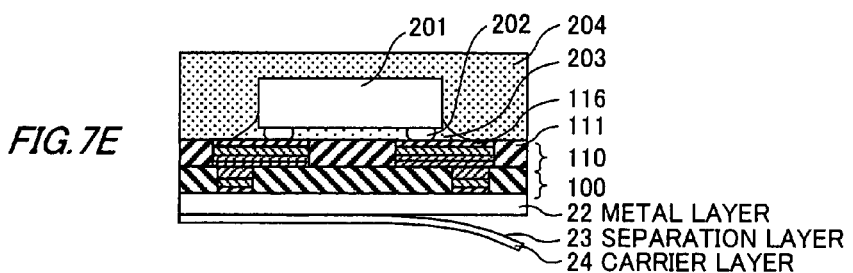
Figure 7F:
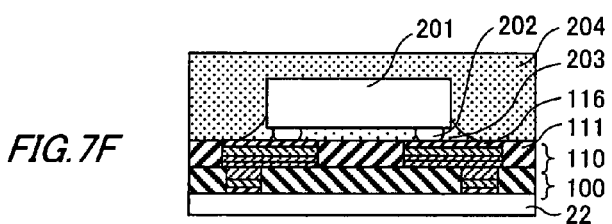

Next, as shown in FIG. 7E, a separation layer 23 and a carrier layer 24 are removed from a metal layer 22 of a copper foil 21 with carrier by the mechanical separation, so that a thin metal layer 22 is remained as shown in FIG. 7F.

Figure 7G:
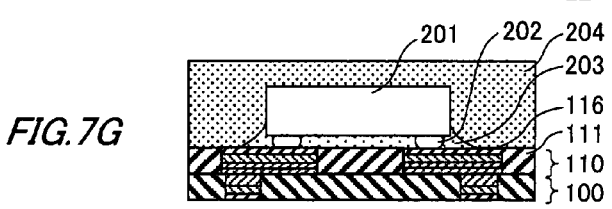

Next, as shown in FIG. 7G, a sulfuric acid-hydrogen peroxide mixed aqueous solution is jetted to the metal layer 22, to remove the metal layer 22 by the chemical dissolution. Etching of the metal layer 22 is conducted until the first plating film 103 of the external connection wiring layer 100 is exposed. The first plating film 103 functions as etching stopper for the metal layer 22. As described above, the core substrate-less multilayer wiring type electronic device 200A can be obtained. In similar manner, the electronic device 200B can be also obtained.

Effect of the Fourth Preferred Embodiment

According to the fourth preferred embodiment, the effects similar to those of the second preferred embodiment can be obtained.

Furthermore, since the copper foil 21 with carrier is used in the fourth preferred embodiment, a time for removing the core substrate can be shortened as described in the effect of the third preferred embodiment.

Fifth Preferred Embodiment

Configuration of Electronic Device Substrate

Figure 8:
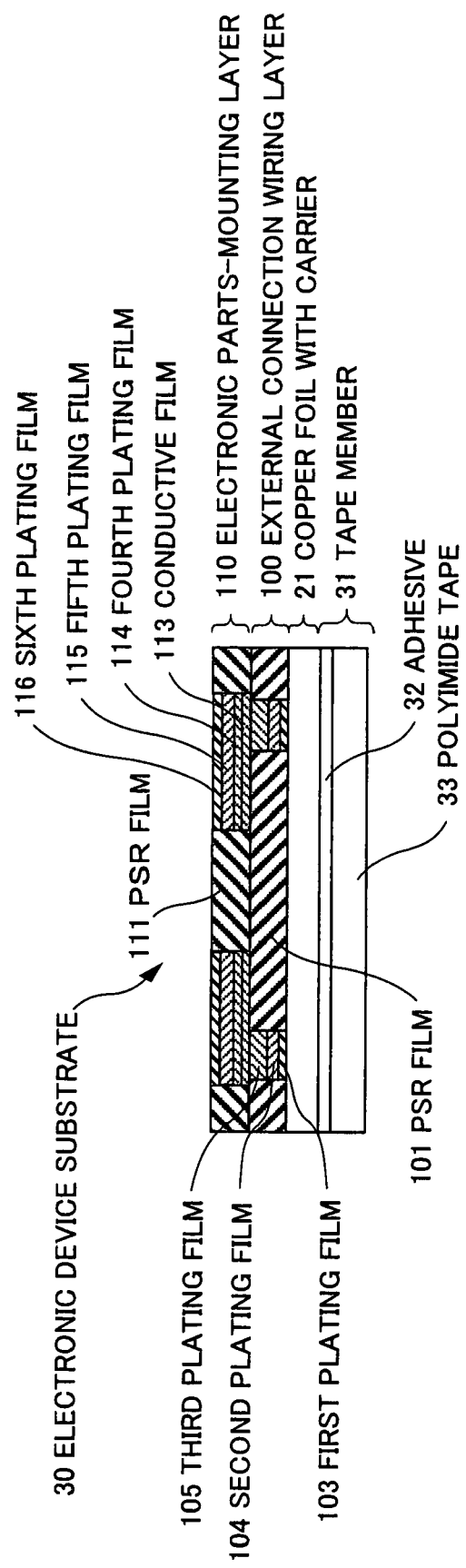
FIG. 8 is a cross sectional view of an electronic device substrate in a fifth preferred embodiment.

FIG. 8 is a cross sectional view of an electronic device substrate in the fifth preferred embodiment according to the present invention.

An electronic device substrate 30 has a configuration similar to that of the electronic device substrate in the third preferred embodiment, and further comprises a tape member 31 provided on one side (a lower surface) of the copper foil 21 with carrier, and the copper foil 21 with carrier is facing to the external connection wiring layer 100 at another side (an upper surface thereof). In FIG. 8, the copper foil 21 with carrier having the separation layer 23 between the metal layer 22 and the carrier layer 24 is illustrated as a single layer for convenience.

The tape member 31 comprises a polyimide tape 33 as an insulation film, and an adhesive 32 with a thickness of 12 µm coated on the polyimide tape 33. The tape member 31 functions as a supporting substrate (holding function) to facilitate a transportation of the electronic device substrate in assembling process of the electronic device.

(Method for Fabricating the Electronic Device Substrate)

Next, a method for fabricating an electronic device in the fifth preferred embodiment will be described with reference to FIGS. 9A to 9P.

Figure 9A:
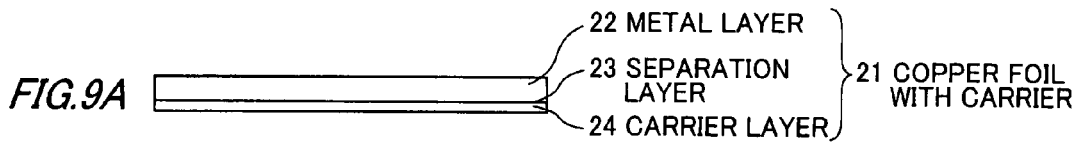
FIGS. 9A to 9P are explanatory diagrams showing a manufacturing process of the electronic device substrate of FIG. 8.

FIGS. 9A to 9P are explanatory diagrams showing a manufacturing process of the electronic device using the electronic device substrate in the fifth preferred embodiment. In FIGS. 9A to 9P, a copper foil 21 with carrier having a separation layer 23 between a metal layer 22 and a carrier layer 24 is illustrated as a single layer for convenience.

Firstly, as shown in FIG. 9A, the copper foil 21 with carrier having a triple layer configuration (metal layer 22/separation layer 23/carrier layer 24) is prepared.

Figure 9B:

Further, as shown in FIG. 9B, a tape member 31 comprising a polyimide tape 33 coated with an adhesive 32 having a thickness of e.g. 12 μm is prepared as the supporting substrate.

Figure 9C:
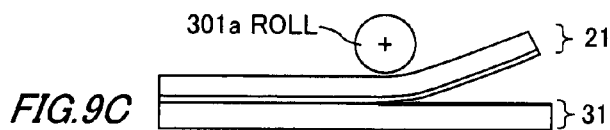
Figure 9D:
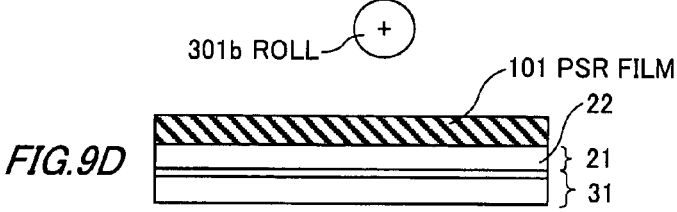
Figure 9E:
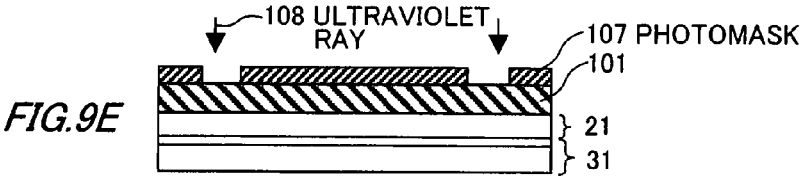
Figure 9F:
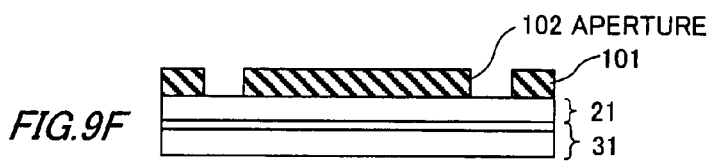
Figure 9G:
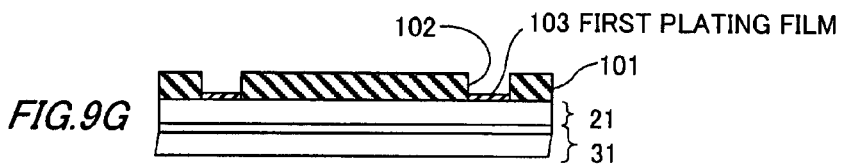
Figure 9H:
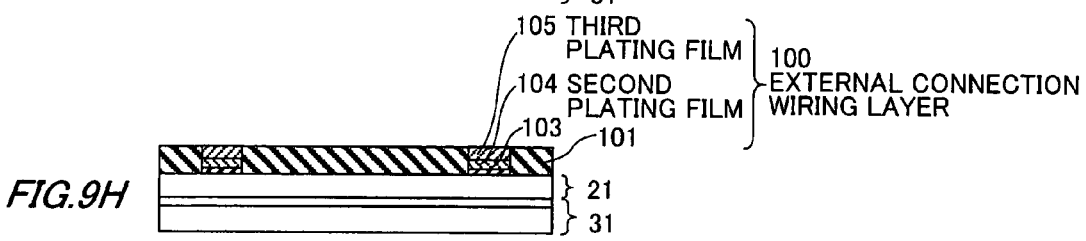

As shown in FIG. 9C, the carrier layer 24 of the copper foil 21 with carrier and the adhesive 32 of the tape member 31 are piled to face to each other, and disposed between a pair of rolls 0301a, 301b. Then the copper foil 21 with carrier and the tape member 31 are affixed by roll laminating method. By this process, the adhesive 32 of the tape member 31 is bonded to a surface of the carrier layer 24.

Since the following manufacturing process (FIG. 9D to 9P) is similar to that in the first and third preferred embodiments, an explanation thereof is omitted.

Effect of the Fifth Preferred Embodiment

According to the fifth preferred embodiment, the effects similar to those of the first preferred embodiment can be obtained.

Furthermore, since the copper foil 21 with carrier and the tape member 31 are used as the core substrate, a physical strength of the whole substrate is increased, so that the substrate is strengthened against a stress applied to the substrate during the substrate manufacturing process and handling of the substrate during the manufacturing process substrate is facilitated.

Sixth Preferred Embodiment

Configuration of Electronic Device

In the sixth preferred embodiment, an electronic device using the electronic device substrate 30 in the fifth preferred embodiment has a configuration similar to that of the second preferred embodiment, since the copper foil 21 with carrier and the tape member 31 as the supporting substrate are removed in the manufacturing process.

(Method for Fabricating the Electronic Device)

Next, a method for fabricating an electronic device in the sixth preferred embodiment will be described with reference to FIGS. 10A to 10G.

FIGS. 10A to 10G are explanatory diagrams showing a manufacturing process of the electronic device using the electronic device substrate in the fifth preferred embodiment. In FIGS. 10A to 10G, a copper foil 21 with carrier having a separation layer 23 between a metal layer 22 and a carrier layer 24 is illustrated as a single layer for convenience.

Firstly, an electronic device substrate 30 in the fifth preferred embodiment is prepared. Then, as shown in FIG. 10A, a bump 202 is provided at an output electrode of an electronic part 201.

Since a part of the manufacturing process (FIG. 10B to 10D) is similar to that in the second preferred embodiment, an explanation thereof is omitted.

Next, as shown in FIG. 10E, the separation layer 23, the carrier layer 24, and a tape member 31 are removed from the metal layer 22 of the copper foil 21 by the mechanical separation, so that the thin metal layer 22 is remained as shown in FIG. 10F.

Next, a step (FIG. 10G) in the manufacturing process is similar to that in the fourth preferred embodiment, an explanation thereof is omitted.

Effect of the Sixth Preferred Embodiment

According to the six preferred embodiment, the effects similar to those of the second preferred embodiment can be obtained.

Furthermore, since the copper foil 21 with carrier is used, a time for removing the core substrate can be shortened as described in the effect of the fourth preferred embodiment. In the meantime, since the tape member 31 is applied to the copper foil 21 with carrier, a physical strength of the substrate is increased, so that troubles such as cracks of the substrate due to a stress applied to the substrate during the substrate manufacturing process can be avoided as described in the fifth preferred embodiment.

Seventh Preferred Embodiment

Configuration of Electronic Device Substrate

FIG. 11 is a cross sectional view of an electronic device substrate in the seventh preferred embodiment according to the present invention.

An electronic device substrate 40 has a configuration similar to that of the electronic device substrate in the fifth preferred embodiment, except that the electronic parts-mounting layer 110 is replaced with an electronic parts-mounting layer 130 using a polyimide material 131 attached with a copper foil 132. In FIG. 11, a copper foil 21 with carrier having a separation layer 23 between a metal layer 22 and a carrier layer 24 is illustrated as a single layer for convenience.

An electronic device substrate 40 comprises a copper foil 21 with carrier provided with a tape member 31 as the supporting substrate, an external connection wiring layer 100 provided on the copper foil 21 with carrier, and an electronic parts-mounting layer 130 provided on the external connection wiring layer 100.

Next, configuration of the electronic parts-mounting layer 130 will be explained below.

On the external connection wiring layer 100, a conductive film 113 and the polyimide material 131 having the copper foil 132 at its upper surface are provided, and a seventh plating film 135 is formed on the conductive film 113. A total thickness of the conductive film 113 and the seventh plating film 135 is determined to be equal to or lower than a thickness of the polyimide material 131. At least a part of the conductive film 113 is electrically connected to a third plating film 105 that is an uppermost layer of the external connection wiring layer 100, and at least a part of the seventh plating film 135 is electrically connected to the conductive film 113.

An eighth plating film 136 is applied to the upper surface of the polyimide material 131 in an area equal to or larger than an area of the copper foil 132 and the seventh plating film 135. The copper foil 132 and the seventh plating film 135 are electrically connected to each other.

Furthermore, a ninth plating film 137 is provided to cover the eighth plating film 136.

A combination of the conductive film 113, the seventh to ninth plating films 135 to 137, the copper foil 132, and the polyimide material 131 constitutes the electronic parts-mounting layer 130, and a thickness of the electronic parts-mounting layer 130 is determined to be not greater than 50 μm, so as to reduce the thickness of the electronic device.

The seventh to ninth plating films 135 to 137 are configured with considering the installation of the electronic part and electrical bonding with the metal thin wire.

The seventh plating film 135 is provided as an intermediate conductive plating for taking an electrical connection between the conductive film 113 and the eighth plating film 136. As a material of the seventh plating film 135, a copper plating is preferable from point of views such as high electrical conductivity and cost. Other materials such as a copper alloy, a nickel, or a nickel alloy may be also used. A thickness of the seventh plating film 135 is determined such that a surface of the seventh plating film 135 is in the same plane as a surface of the polyimide material 131.

The eighth plating film 136 is required to be composed of a hard material, since a bump 202 of an electronic part 201 is electrically connected to the ninth plating film 137 provided on the eighth plating film 136 by using supersonic wave, thermo-compression bonding or the combination thereof. As the material of the eighth plating film 136, for example, the nickel which is comparatively hard material may be used (with a thickness of e.g. 0.75 μm). As the material of the eighth plating film 136, a nickel or a palladium is suitable, however, it is not the limited thereto, and other materials may be used in accordance with the bonding method of the electronic part.

The ninth plating film 137 is an uppermost layer of the electronic parts-mounting layer 130 for mounting the electronic part 201. The ninth plating film 137 is provided for taking the electrical connection with the bump 202 of the electronic part 201. As the material of the ninth plating film 137, a gold, a silver, a palladium or the like may be used. In addition, a gold, a tin, a palladium or a solder plating or the like is required when the electronic parts, on which a gold bump or a solder bump is formed, are bonded by the flip-chip method.

(Method for Fabricating the Electronic Device Substrate)

Next, a method for fabricating an electronic device in the seventh preferred embodiment will be described with reference to FIGS. 12A to 12Q.

FIGS. 12A to 12Q are explanatory diagrams showing a manufacturing process of the electronic device using the electronic device substrate in the sixth preferred embodiment. In FIGS. 12A to 12Q, a copper foil 21 with carrier having a separation layer 23 between a metal layer 22 and a carrier layer 24 is illustrated as a single layer for convenience.

Since a part of the manufacturing process (FIGS. 12A to 12K) is similar to that in the fifth preferred embodiment, an explanation thereof is omitted.

As shown in FIG. 12L, a polyimide material 131 as an insulation film on which a copper foil 132 is attached by adhesive or vacuum deposition is used, and a surface of an external connection wiring layer 100 including the conductive film 113 is covered with the polyimide material 131. Successively, the polyimide material 131 that is in contact with the external connection wiring layer 100 and the conductive film 113 is fusion-bonded by the thermo-compression bonding.

Next, as shown in FIGS. 12M and 12N, an aperture 134 is formed by using a mask 133. As a technique for forming the aperture 134, the etching process is used. Although etching liquid for the polyimide material 131 is different from that for the copper foil 132, the mask 133 of a single unit can be used for etching of both materials. As other technique, the aperture 134 can formed by using laser treatment. However, the thickness of copper foil 132 will be limited.

Next, as shown in FIG. 12O, the copper foil 132 provided with the aperture 134 is formed to have a desired shape for mounting an electronic part by etching or the like.

Next, as shown in FIGS. 12P and 12Q, the seventh plating film 135, the eighth plating film 136, and the ninth plating film 137 are sequentially formed on the aperture 134 by conductive plating to provide the electronic parts-mounting layer 130 having the polyimide material 131 with the copper foil 132. As described above, the electronic device substrate 40 is fabricated.

Effect of the Seventh Preferred Embodiment

According to the seventh preferred embodiment, the effects similar to those of the fifth preferred embodiment can be obtained.

Furthermore, since the electronic parts-mounting layer 130 is constituted by laminating single layer materials using the polyimide material 131 with the copper foil 132, the number of the wiring layers can be increased by one layer while using a method approximately similar to the fifth preferred embodiment.

Eighth Preferred Embodiment

Configuration of Electronic Device

Figure 13A:
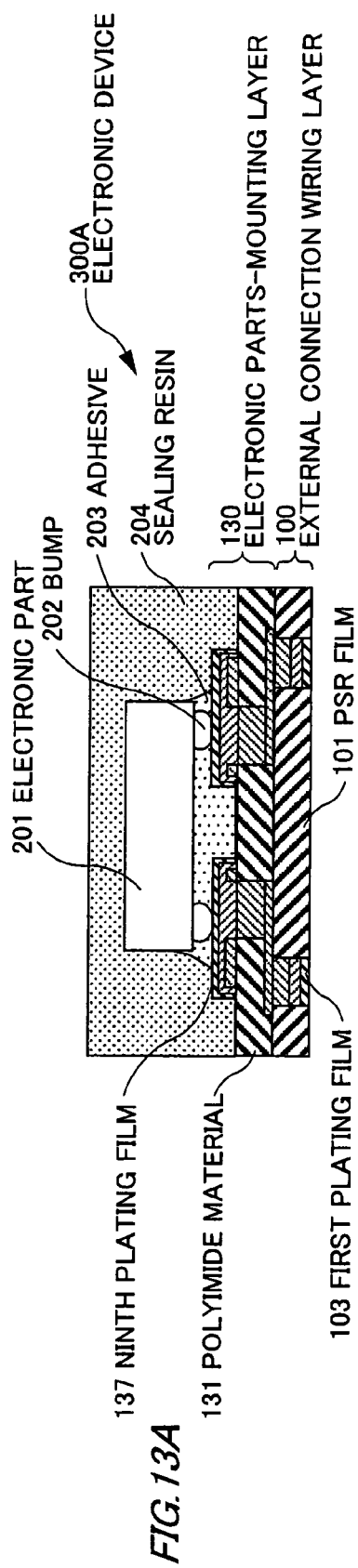
Figure 13B:
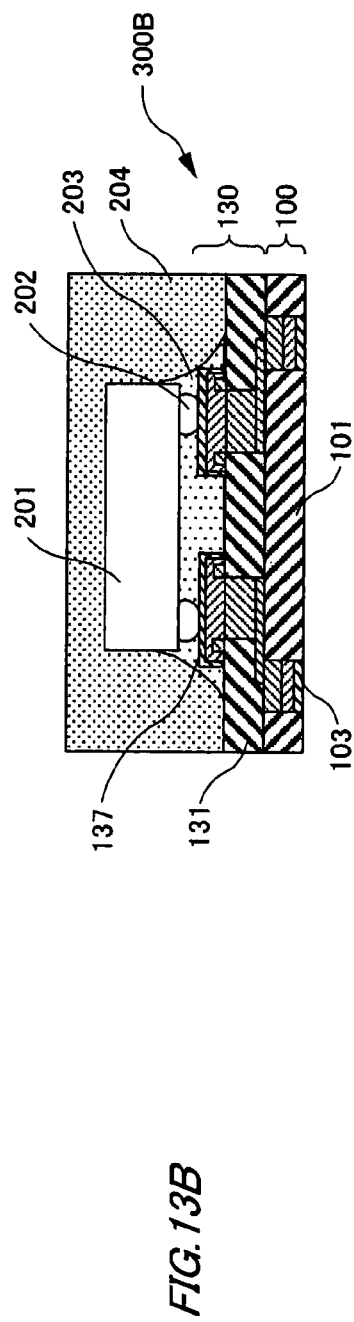

FIGS. 13A and 13B are cross sectional views of an electronic device in the eighth preferred embodiment according to the present invention, wherein FIG. 13A is a cross sectional view showing an electronic device using the electronic device substrate in the seventh preferred embodiment, and FIG. 13B is a cross sectional view showing an electronic device using a variation of the electronic device substrate in the seventh preferred embodiment.

In the variation of the electronic device substrate in seventh preferred embodiment, a width of a conductive film 113 of an electronic parts-mounting layer 130 is made narrower than that of the seventh preferred embodiment, such that both ends of the conductive film 113 is dislocated from both sides of the electronic device to a portion in vicinity of a center, namely, a distance from the both sides of the electronic device to the conductive film 113 is broadened.

In FIGS. 13A and 13B, same reference numerals as the electronic device substrate shown in FIG. 11 are partially omitted.

An electronic device 300A shown in FIG. 13A comprises an electronic device substrate 40 in the seventh preferred embodiment and an electronic part 201 electrically connected to an electronic parts-mounting layer 130 of the electronic device substrate 40 via a bump 202. However, a copper foil 21 with carrier and a tape member 31 of the electronic device substrate 40 are already removed.

The electronic part 201 and the electronic parts-mounting layer 130 are fixed to each other by means of an adhesive 203, so as to reinforce the electrical connection between the bump 202 and the electronic parts-mounting layer 130. In addition, a circumference of the electronic part 201 is covered with a sealing resin 204 for protecting the electronic part 201.

A conductive plating of the external connection wiring layer 100 of the electronic device substrate 40 comprises a first plating film 103 used for external connection, a second plating film 104 functioning as a barrier layer for preventing a trouble due to diffusion of tin (Sn) in the solder into a metal of an external terminal, when the solder is used for connecting the completed electronic device to an external substrate (mounting substrate: mother board), and a third plating film 105 used for electrically connecting with the electronic parts-mounting layer 130, that are integrally formed.

The electronic parts-mounting layer 130 comprises a conductive film 113 electrically connected to the third plating film 105, a seventh plating film 135 as a via-hole conductor, that are integrally formed, a copper foil 132 as an internal circuit wiring (conductor pattern), and eighth and ninth plating films 136, 137 electrically connected to the seventh plating film 135 and the copper foil 132. The conductive film 113 has a function as a via-hole conductor for electrical connection other than a function as an internal circuit wiring (conductor pattern). In other words, an electrical signal of the electronic part 201 is transmitted to the first plating film 103 through the bump 202, the conductive plating films comprising the seventh to ninth plating films 135 to 137 of the electronic parts-mounting layer 130, the conductive film 113, and the third plating films 105 and the second plating films 104 of the external connection wiring layer 100.

An electronic device 300B shown in FIG. 13B has a configuration and functions similar to the electronic device 300A, except that the variation of the electronic device substrate 40 in the seventh preferred embodiment is used.

(Method for Fabricating the Electronic Device)

Next, a method for fabricating an electronic device in the eighth preferred embodiment will be described with reference to FIGS. 14A to 14G.

FIGS. 14A to 14G are explanatory diagrams showing a manufacturing process of the electronic device using the electronic device substrate in the seventh preferred embodiment. In FIGS. 14A to 14G, a copper foil 21 with carrier having a separation layer 23 between a metal layer 22 and a carrier layer 24 is illustrated as a single layer for convenience.

Since the manufacturing process (FIGS. 14A to 14G) is similar to that in the fifth preferred embodiment except that the electronic device substrate 30 is replaced with the electronic device substrate 40 comprising the electronic parts-mounting layer 130, an explanation thereof is omitted.

Effect of the Eighth Preferred Embodiment

According to the eighth preferred embodiment, the effects similar to those of the second preferred embodiment can be obtained.

Furthermore, as described in the seventh preferred embodiment, since the electronic parts-mounting layer 130 is constituted by laminating single layer materials using the polyimide material 131 with the copper foil 132, the number of the wiring layers can be increased by one layer, so that the electronic device with higher function can be realized.

Still further, as an effect particular to the electronic device 300B, a width of the conductive film 113 of the electronic parts-mounting layer 130 is reduced such that the position of the conductive film 113 of the electronic parts-mounting layer 130 is dislocated from the sides of the electronic device to the center part, so that an area of the electronic device can be reduced compared with that of the electronic device 300A.

Other Embodiments of the Present Invention

The present invention is not limited to the preferred embodiments as described above, and can be changed within a scope of the invention which is not deviated from or goes beyond the technical concept of the present invention.

Figure 15:
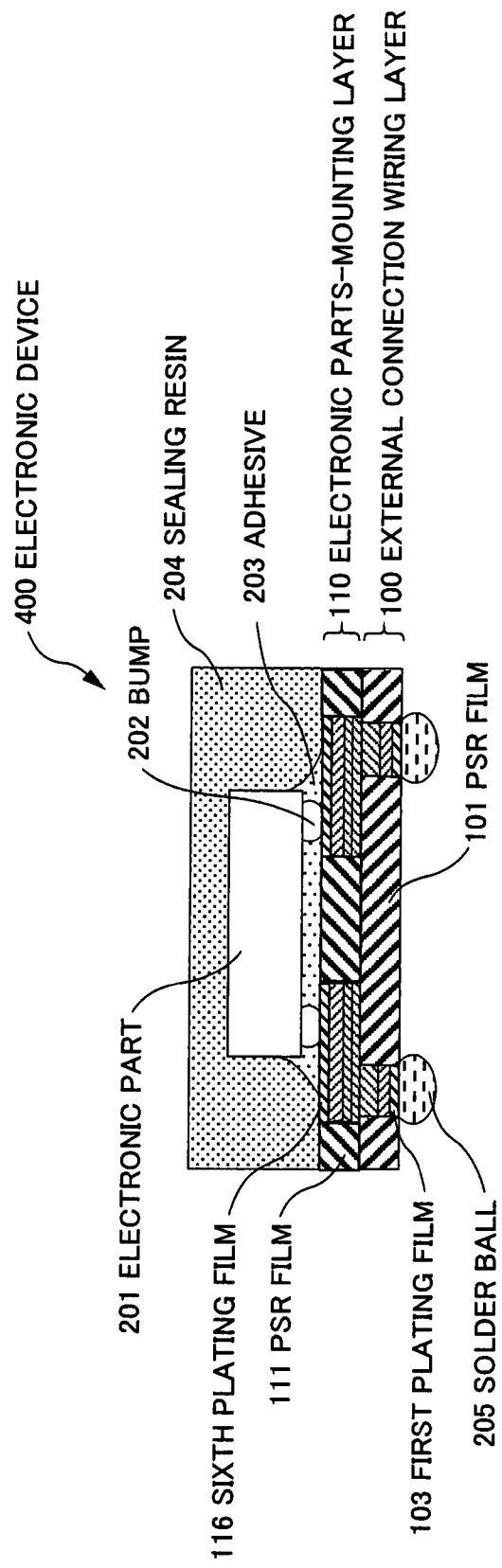
FIG. 15 is a cross sectional view of a BGA type electronic device in an embodiment according to the present invention.

(1) FIG. 15 is a cross sectional view of a BGA type electronic device in the other embodiment according to the present invention. In the preferred embodiments as described above, a LGA (land Grid Array) type electronic device, in which an external output terminal is an intact plating, is shown as an example. However, a BGA (Ball Grid Array) type electronic device using a solder ball 205 as the external output terminal may be used like an electronic device 400 shown in FIG. 15. For this case, it is advantageous in that the bonding between the electronic device and the mounting substrate can be easily implemented by using the solder ball.

(2) FIG. 16 is a cross sectional view of a wire bonding type electronic device in another embodiment according to the present invention.

In the preferred embodiments as described above, the flip-chip method is used for mounting the electronic part 201 by means of the bump 202. Other than the flip-chip bonding, like an electronic device as shown in FIG. 16, the electronic part 201 may be bonded to the electronic parts-mounting layer 110 by die-bonding to provide an electrical signal connection by wire bonding using a thin metallic wire (e.g. Au-wire 206). For this case, it is advantageous in that the wire bonding method with a high general versatility compared with the flip-chip method can be used.

(3) In the preferred embodiments as described above, examples using a single electronic part 201 are shown. However, so-called multi-chip package equipped with several components may be used without any problem.

(4) The present invention may be applied to an electronic device in which several electronic parts are installed in a shape of array in a unit area then collectively sealed with resin, and cut into single pieces respectively corresponding to a unit device by dicing or the like. For this case, the electronic device manufacturing process can be conducted under a batch processing, so that a time required for fabricating the single piece of the electronic device can be shortened, compared with a case where the electronic devices are fabricated by piece by piece.

(5) In the preferred embodiments as described above, examples of double wiring layer substrate configuration are shown. However, it is also possible to provide the configuration in that more than three wiring layers are laminated, and the present invention can be applied to the multilayer wiring substrate.

For example, FIGS. 17A and 17B are cross sectional views of the electronic device substrates in the preferred embodiments according to the present invention, wherein FIG. 17A is a cross sectional view showing the electronic device substrate (four layers), and FIG. 17B is a cross sectional view showing the electronic device substrate (triple layers).

The electronic device substrate (four layers) 50A shown in FIG. 17A comprises an internal wiring layer 1 and another internal wiring layer 2 between an external connection wiring layer 100A and an electronic parts-mounting layer 110. Each of the internal wiring layers 1, 2 comprises a conductive film 113 as a circuit wiring (wiring pattern), a fourth plating film 114 as a via-hole conductor, and a fifth plating film 115 in an aperture of a PSR film 111 (the fifth plating film 115 may be omitted). Since the internal wiring layer 2 is provided between the internal wiring layer 1 and the electronic parts-mounting layer 110, wirings of the internal wiring layer 1 and electronic parts-mounting layer 110 can be disposed in a shifted (or torsional) relationship, so that an increase in the area of the electronic device can be prevented, while avoiding a short circuit. In addition, since the internal wiring layer 1 is provided on the external connection wiring layer 100A, the circuit wiring part is not exposed to a lower (back) surface of the electronic device, so that it is possible to prevent the wirings from the short circuit due to the solder for mounting.

On the other hand, the electronic device substrate (triple layers) 50B shown in FIG. 17B comprises a single internal wiring layer 2 between an external connection wiring layer 100B and an electronic parts-mounting layer 110. The external connection wiring layer 100A has functions of both of the internal wiring layer 1 and the external connection wiring layer 100B in the electronic device substrate 50A. As a result, there is an advantage in that one layer in the multilayer configuration can be reduced compared with the electronic device substrate 50A. In the first plating film 103, a part closed to a center part of the external connection wiring layer 100B constitutes a circuit wiring, so that the circuit wiring is exposed during the electronic device manufacturing process. Therefore, it is preferable to conduct a treatment for preventing the short circuit due to the solder for mounting.

An electronic device with more than five layers can be realized by laminating the internal wiring layers, similarly to the electronic device with triple layers and the electronic device with four layers.

(6) In the preferred embodiments as described above, semiconductor devices are shown as examples. However, the substrate in the present invention may be employed as a substrate used in electronic parts such as a capacitor, resistor, coil and a functional component such as a sensor, microphone, other than the semiconductor devices. In particular, the present invention is preferably applied to the electronic device used in a mobile telephone or IC card that is required to be thin and small.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. An electronic device substrate comprising:
   a core substrate;
   an external connection wiring layer provided on the core substrate comprising an external connection terminal and a first electrical insulating material; and
   a circuit wiring layer provided on the external connection wiring layer and laminated for one or more layers comprising an internal conductor pattern and a second electrical insulating material, a surface of the internal conductor pattern being in a same plane as a surface of the second electrical insulating material.

2. The electronic device substrate, according to claim 1, wherein:
   the circuit wiring layer further comprises a via-hole conductor provided at an aperture of the second electrical insulating material, and the via-hole conductor is integrated with the internal conductor pattern.

3. The electronic device substrate, according to claim 2, wherein:
   the via-hole conductor comprises one or more plating films.

4. The electronic device substrate, according to claim 2, wherein:
   the via-hole conductor comprises a single layer or a laminated layer composed of a gold, a silver, a copper, a copper alloy, a nickel, a nickel alloy, or palladium.

5. The electronic device substrate, according to claim 3, wherein:
   an uppermost layer of the circuit wiring layer is an electronic-parts mounting layer, and an uppermost layer of the plating films in the electronic parts-mounting layer is subjected to a surface treatment necessary for connection with an electronic part.

6. The electronic device substrate, according to claim 1, wherein:
   an uppermost layer of the circuit wiring layer is an electronic-parts mounting layer, and an external conductor pattern is formed on a surface for mounting an electronic part.

7. The electronic device substrate, according to claim 6, wherein:
   the external conductor pattern comprises a copper foil.

8. The electronic device substrate, according to claim 6, wherein:
   the second electrical insulating material comprises a polyimide or an epoxy when provided as an uppermost layer disposed at an opposite side to the core substrate, and comprises a solder resist or a photosolder resist when provided as a layer other than the uppermost layer.

9. The electronic device substrate, according to claim 1, wherein:
   the core substrate comprises a copper foil, a stainless steel foil, an aluminum foil, an aluminum alloy foil, a nickel foil, a nickel alloy foil, a tin foil or a tin alloy foil.

10. The electronic device substrate, according to claim 1, wherein:
    the core substrate comprises:
       a carrier layer composed of a metal;
       a separation layer formed on the carrier layer; and
       a metal layer formed on the separation layer and disposed at a side of the external connection wiring layer.

11. The electronic device substrate, according to claim 10, wherein:
    an adhesion force between the metal layer and the carrier layer via the separation layer is smaller than that between the metal layer and the external connection wiring layer.

12. The electronic device substrate, according to claim 10, wherein:
    the separation layer comprises an organic system separation layer or an inorganic system separation layer.

13. The electronic device substrate, according to claim 10, wherein:
    the metal layer comprises a copper foil, a copper alloy foil, a stainless steel foil, an aluminum foil, an aluminum alloy foil, a nickel foil, a nickel alloy foil, a tin foil or a tin alloy foil.

14. The electronic device substrate, according to claim 1, further comprising:
    a supporting substrate attached to the core substrate.

15. The electronic device substrate, according to claim 14, wherein:
    the supporting substrate comprises an insulating film.

16. The electronic device substrate, according to claim 1, wherein:
    the second electrical insulating material comprises a solder resist or a photosolder resist.

17. The electronic device substrate, according to claim 1, wherein:
    the internal conductor pattern comprises a copper, a copper alloy, a nickel, or a nickel alloy.

18. The electronic device substrate, according to claim 1, wherein:
    the external connection terminal comprises an external connection plating film formed at an aperture of the first electrical insulating film.

19. The electronic device substrate, according to claim 18, wherein:

the external connection wiring layer further comprises a tin-diffusion preventing plating film formed at an aperture of the first electrical insulating film, and the tin-diffusion preventing plating film is integrated with the external connection plating film.

20. The electronic device substrate, according to claim 19, wherein:
a thickness of the tin-diffusion preventing plating film is 5 μm or more when the tin-diffusion preventing plating film comprises a copper or copper alloy plating, and 3 μm or more when the tin-diffusion preventing plating film comprises a nickel or nickel alloy plating.

21. An electronic device comprising:
an electronic device substrate including:
an external connection wiring layer comprising an external connection terminal and a first electrical insulating material; and
a circuit wiring layer provided on the external connection wiring layer and laminated for one or more layers comprising an internal conductor pattern and a second electrical insulating material, a surface of the internal conductor pattern being in a same plane as a surface of the second electrical insulating material; and
an electronic part provided on the electronic device substrate.

22. The electronic device, according to claim 21, wherein:
the external connection terminal is connected to a solder ball.

23. The electronic device, according to claim 21, wherein:
the electronic part is electrically connected to the electronic device substrate via a metal thin wire.

24. The electronic device, according to claim 21, wherein:
the electronic part is electrically connected to the electronic device substrate via a bump.

* * * * *